(12) United States Patent
Chen et al.

(10) Patent No.: US 11,328,898 B2
(45) Date of Patent: May 10, 2022

(54) DIGITAL DETECTOR, APPARATUS OF CHARGED-PARTICLE BEAM SUCH AS ELECTRON MICROSCOPE COMPRISING THE SAME, AND METHOD THEREOF

(71) Applicants: Zhongwei Chen, Los Altos Hills, CA (US); Xiaoming Chen, Sunnyvale, CA (US); Daniel Tang, Fremont, CA (US); Liang-Fu Fan, Fremont, CA (US)

(72) Inventors: Zhongwei Chen, Los Altos Hills, CA (US); Xiaoming Chen, Sunnyvale, CA (US); Daniel Tang, Fremont, CA (US); Liang-Fu Fan, Fremont, CA (US)

(73) Assignee: BORRIES PTE. LTD., Singapore (SG)

( * ) Notice: Subject to any disclaimer, the term of this patent is extended or adjusted under 35 U.S.C. 154(b) by 0 days.

(21) Appl. No.: 17/305,514

(22) Filed: Jul. 8, 2021

(65) Prior Publication Data
US 2022/0108867 A1    Apr. 7, 2022

Related U.S. Application Data

(60) Provisional application No. 63/087,238, filed on Oct. 4, 2020.

(51) Int. Cl.
*H01J 37/244*  (2006.01)
*H01J 37/28*   (2006.01)
*H01J 37/22*   (2006.01)

(52) U.S. Cl.
CPC .......... *H01J 37/244* (2013.01); *H01J 37/222* (2013.01); *H01J 37/28* (2013.01); *H01J 2237/0435* (2013.01); *H01J 2237/2445* (2013.01)

(58) Field of Classification Search
CPC ........ H01J 37/244; H01J 37/28; H01J 37/222; H01J 2237/2445; H01J 2237/0435
See application file for complete search history.

(56) References Cited

U.S. PATENT DOCUMENTS

| | | | | |
|---|---|---|---|---|
| 5,391,879 A | * | 2/1995 | Tran | G01T 1/2018 250/367 |
| 5,453,617 A | * | 9/1995 | Tsuneta | H01J 37/252 250/311 |
| 5,519,227 A | * | 5/1996 | Karellas | G01T 1/202 250/370.11 |
| 5,572,034 A | * | 11/1996 | Karellas | G01T 1/2018 250/367 |
| 5,596,198 A | * | 1/1997 | Perez-Mendez | G01T 1/1642 250/363.02 |
| 6,121,622 A | * | 9/2000 | Beyne | H01J 47/02 250/338.4 |

(Continued)

*Primary Examiner* — David A Vanore
(74) *Attorney, Agent, or Firm* — George Guosheng Wang; United States Research and Patent Firm

(57) ABSTRACT

The present invention provides a digital high-resolution detector for detecting X-ray, UV light or charged particles. In various embodiments, the digital detector comprises an array of CMOS or CCD pixels and a layer of conversion material on top of the array designed for converting incident X-ray, UV light or charged particles into photons for CMOS or CCD sensors to capture. The thin and high-resolution detector of the invention is particularly useful for monitoring and aligning beams in, and optimizing system performance of, an apparatus of charged-particle beam e.g. an electron microscope.

19 Claims, 23 Drawing Sheets

(56) References Cited

U.S. PATENT DOCUMENTS

| | | | | |
|---|---|---|---|---|
| 6,362,482 | B1* | 3/2002 | Stettner | G01T 1/1644 250/370.08 |
| 6,362,484 | B1* | 3/2002 | Beyne | G01T 1/2935 250/338.4 |
| 6,765,609 | B1* | 7/2004 | Kinoshita | G01J 3/2823 250/390.07 |
| 9,202,669 | B2* | 12/2015 | Hirato | H01J 37/1478 |
| 11,099,282 | B2* | 8/2021 | Nelson | G01T 1/22 |
| 2002/0088940 | A1* | 7/2002 | Watanabe | H01J 37/224 250/310 |
| 2003/0169847 | A1* | 9/2003 | Karellas | A61B 6/482 378/98.3 |
| 2004/0000630 | A1* | 1/2004 | Spartiotis | G01T 1/2964 250/208.1 |
| 2011/0309236 | A1* | 12/2011 | Tian | H01L 27/14687 250/208.1 |
| 2015/0001411 | A1* | 1/2015 | Friedman | G01T 1/2935 250/375 |
| 2015/0041649 | A1* | 2/2015 | Wang | H01J 37/222 250/310 |
| 2015/0276947 | A1* | 10/2015 | Hoenk | G01T 1/248 250/363.03 |
| 2016/0064184 | A1* | 3/2016 | Brown | H01L 27/1464 250/307 |
| 2016/0148780 | A1* | 5/2016 | Agrawal | H01J 37/244 250/307 |
| 2017/0178862 | A1* | 6/2017 | Ogasawara | H01J 37/153 |
| 2018/0073866 | A1* | 3/2018 | Tarabrin | G01B 11/272 |
| 2018/0107124 | A1* | 4/2018 | Tukker | G01B 11/272 |
| 2018/0254167 | A1* | 9/2018 | Zhao | H01J 37/28 |
| 2018/0348645 | A1* | 12/2018 | Ravensbergen | G01B 11/272 |
| 2019/0004437 | A1* | 1/2019 | Bhattacharyya | G03F 7/70058 |
| 2021/0223412 | A1* | 7/2021 | Gu | G01T 1/20181 |

* cited by examiner

Figure 20

DIGITAL DETECTOR, APPARATUS OF CHARGED-PARTICLE BEAM SUCH AS ELECTRON MICROSCOPE COMPRISING THE SAME, AND METHOD THEREOF

CROSS-REFERENCE TO RELATED APPLICATIONS

This application expressly claims the benefit under 35 U.S.C. Section 119(e) and Article 4 of the Stockholm Act of the Paris Convention for the Protection of Industrial Property of U.S. Provisional Patent Application No. 63/087,238, filed Oct. 4, 2020, entitled "Several Designs for Apparatus of Charged-Particle Beam and Methods Thereof," the entire disclosure of which is hereby incorporated by reference.

FIELD OF THE INVENTION

The present invention generally relates to a digital detector for detecting X-ray, UV light or charged particles, an electronic apparatus/device using the same, and an apparatus of charged-particle beam such as electron microscope using the same. Although the invention will be illustrated, explained, and exemplified by electron microscopes, it should be appreciated that the present invention can also be applied to other fields, for example, electron beam recorder, electron beam lithography system, and the like.

BACKGROUND OF THE INVENTION

Apparatuses of charged-particle beam such as transmission electron microscope (TEM) and scanning transmission electron microscope (STEM) are widely used in fields of medical diagnosis, biological research, material analysis, and semiconductor inspection etc. With their high-resolution image technique, TEM and STEM are used as a particularly important diagnostic tool to screen virus, human tissues at high magnification (the ultrastructural level) or material analysis, often in conjunction with other methods, particularly light microscopy, immunofluorescence techniques and PCR etc.

For example, TEM/STEM has great potential for diagnostic purposes when it (1) provides useful (complementary) information in the context of a carefully considered differential diagnosis; (2) provides an 'improved' diagnosis that results in better treatment strategies and; (3) is time & cost effective in respect to alternative techniques. For diagnostic purposes, solid tissues or virus sample can be prepared for TEM/STEM in the same way as other biological tissues. The samples are fixed in glutaraldehyde and osmium tetroxide then dehydrated and embedded in epoxy resin. The ultrathin sections may be collected on 3 mm copper (mesh) grids and stained with uranyl acetate and lead citrate to make the contents of the tissue or virus electron dense (and thus visible in the electron microscope).

The beam optical axis should be aligned perfectly to archive design specification. However, it remains a challenge to conveniently monitor the size, shape, intensity distribution of the electron beam spot, the beam position, and the beam angle, let alone variation thereof as a function of time. As a result, the beam's position and/or beam angle in the electron microscope cannot be effectively aligned, and the system performance of the electron microscope cannot be optimized.

If the beam optical axis has a misalignment, then the system's performance will be worsened a lot. Some common beam misalignments in an electron microscope are shown in FIG. 1. M1 in FIG. 1 represents a gun tip emission angle misalignment; M2 represents a first condenser centric axis misalignment with beam axis; M3 represents a second condenser centric axis misalignment with the beam axis; M4 represents a condenser cross-over point misalignment; M5 represents an aperture hole centric axis misalignment; and M6 represents an objective lens misalignment. Since a pure beam can't be seen directly, people will need to use a detector's signal image to acquire alignment information. Advantageously, the present invention provides a solution to solve the problem in the prior art.

SUMMARY OF THE INVENTION

One aspect of the present invention provides a digital detector for detecting X-ray, UV light or charged particles. In various embodiments, the digital detector comprises (A) an array of pixels and (B) a layer of conversion material that is deposited onto the top of the array of pixels. Each pixel includes (i) a photon receiver configured for receiving incident photons, (ii) an optoelectronic converter for converting the photons into electrical signals, and (iii) a digitizer that digitizes the electrical signals. The conversion material is configured for receiving incident X-ray, UV light or charged particles and converting the energy thereof into photons to be received by one or more of the photon receivers.

Another aspect of the present invention provides a general optoelectronic apparatus/device comprising one or more digital detectors as described above, such as a digital imager, x-ray detector, an analytical instrument, and an apparatus of charged-particle beam such as electron microscope and an electron beam lithographical apparatus.

A further aspect of the present invention provides a method of optimizing system performance of an apparatus of charged-particle beam. Step (i) of the method is providing an apparatus of charged-particle beam comprising a charged-particle optical column (such as an electron optical column) and a sample chamber. Step (ii) is removably inserting/affixing one or more digital detectors as described above onto one or more charged-particle optical components (such as electron optical components) within the column and/or chamber components within the sample chamber. Step (iii) is monitoring (1) the size, shape, intensity distribution of the charged-particle beam spot, (2) the beam position and beam angle, and (3) variations of said size, shape, intensity distribution, beam position and beam angle as a function of time, using one or more digital detectors as described above. Step (iv) is aligning the beam's position and/or beam angle based on the results as monitored from (1)-(3) in step (iii). Finally, step (v) is optimizing system performance of the apparatus of charged-particle beam based on the results as monitored from (1)-(3) in step (iii).

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form, omitted, or merely suggested, in order to avoid unnecessarily obscuring the present invention.

FIG. 20 shows the image of a biological sample in a large FOV with low resolution and a small FOV with high resolution in accordance with an exemplary embodiment of the present invention.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

It is also to be understood that the terminology used herein is for the purpose of describing particular embodiments only, and it is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Figure 1:
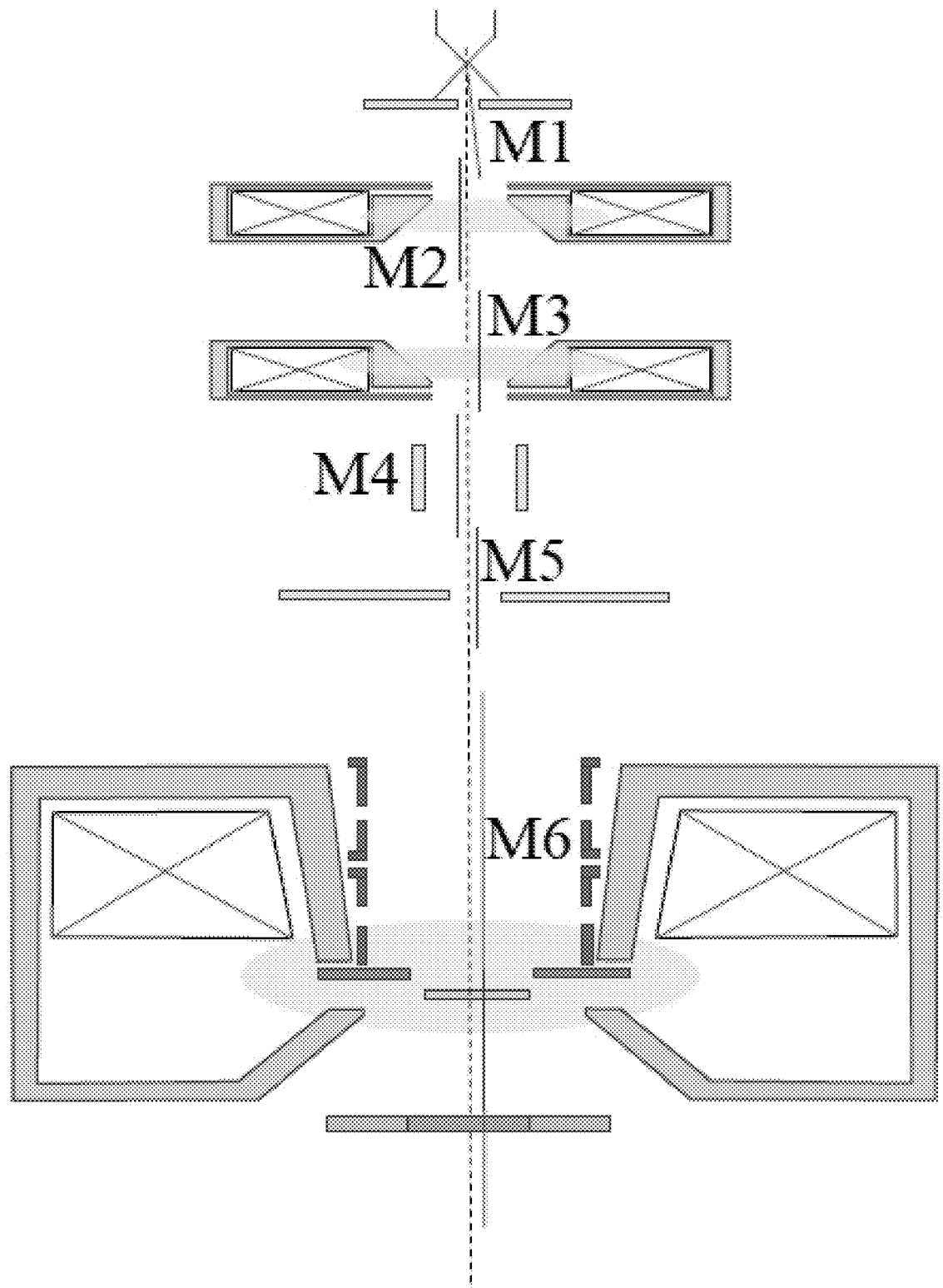
FIG. 1 shows some common electron beam misalignments in an electron microscope.
Figure 2A:
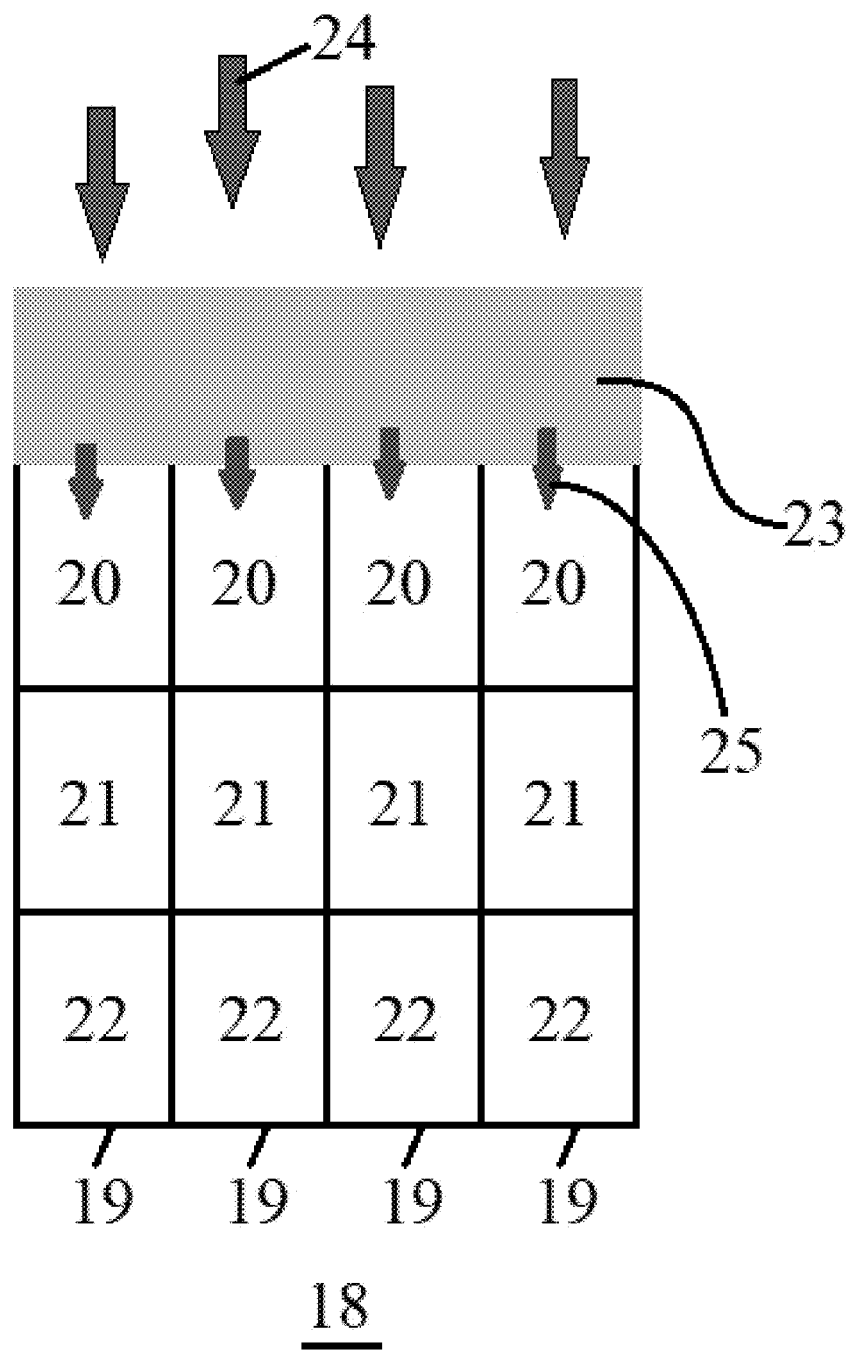
FIG. 2A schematically illustrates a digital detector for detecting X-ray, UV light or charged particles in accordance with an exemplary embodiment of the present invention.

With reference to FIG. 2A, various embodiments of the invention provide a digital detector 18 for detecting X-ray, UV light or charged particles. The digital detector 18 may include (A) an array of pixels 19 and (B) a layer of conversion material 23. Each pixel 19 may include (i) a photon receiver 20 configured for receiving incident photons, (ii) an optoelectronic converter 21 for converting the photons into electrical signals, and (iii) a digitizer 22 that digitizes the electrical signals. The conversion material layer 23 may be deposited onto the top of the array of pixels 19. The conversion material 23 may be configured for receiving incident X-ray, UV light or charged particles 24 and converting the energy thereof into photons 25 to be received by one or more of the photon receivers 20. Typically, photons 25 have a wavelength in the range of 400-800 nm.

Figure 2B:
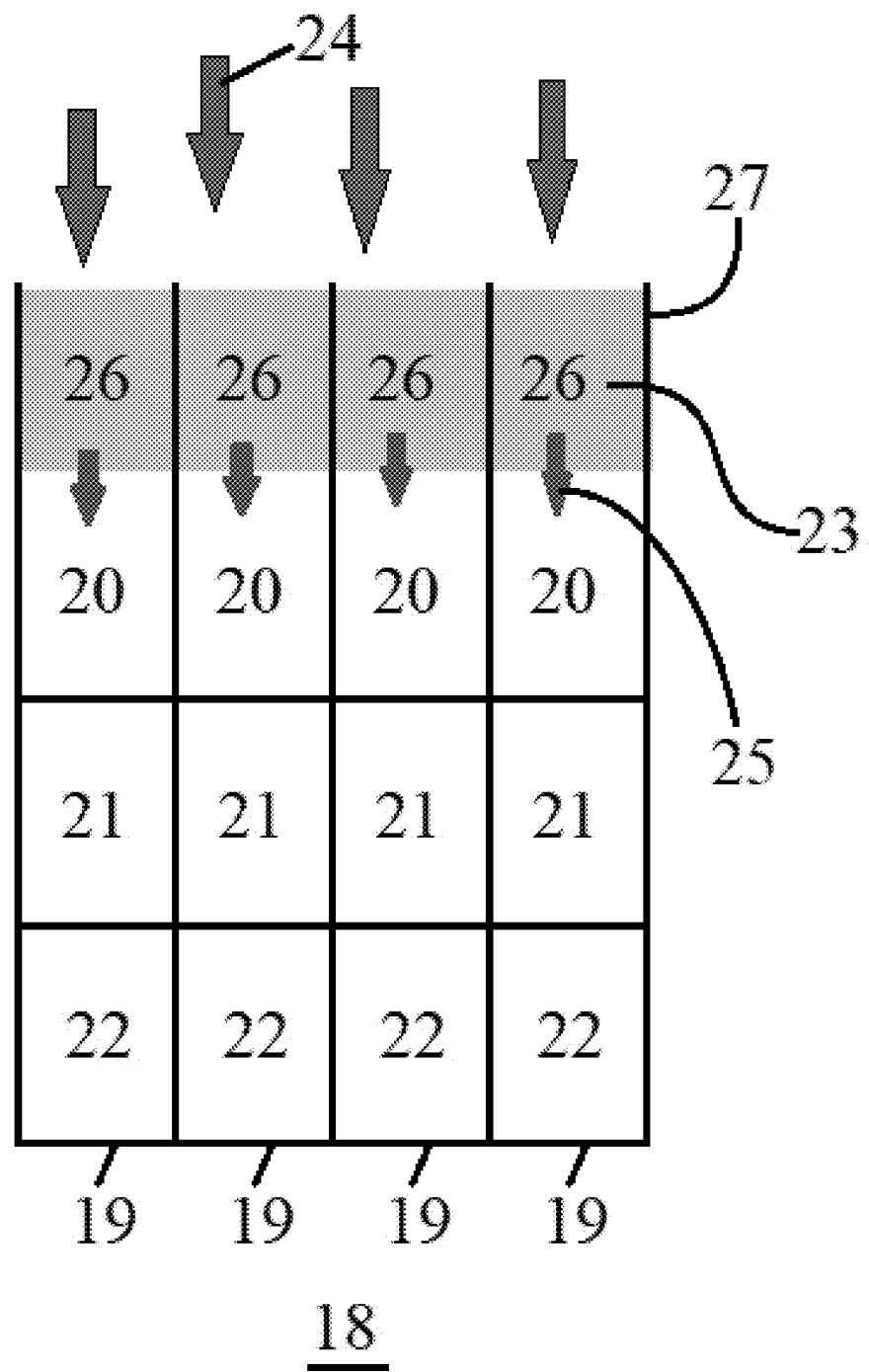
FIG. 2B schematically illustrates an improved digital detector for detecting X-ray, UV light or charged particles in accordance with an exemplary embodiment of the present invention.

In preferred embodiments as shown in FIG. 2B, the layer of conversion material 23 is divided into blocks 26 with separation walls 27. The conversion material 23 within each block 26 may cover one or more pixels 19. After the conversion material 23 within each block 26 receives the incident X-ray, UV light or charged particles 24 and converts the energy thereof into photons 25, the photons 25 are received by the photon receiver(s) 20 in one or more corresponding pixels 19 only and are thus prevented from being received by a photon receiver 20 near or surrounding the one or more corresponding pixels 19. In an embodiment, the incident charged particles 24 is an electron beam, and the conversion material 23 comprises a fluorescent material.

The array of pixels 19 may be based on complementary metal oxide semiconductor (CMOS) image sensor, which may include, but does not have to include, a color filter to filter the received photons 25. Alternatively, the array of pixels 19 may be based on charge-coupled device (CCD) image sensor. A CCD image sensor has an array of capacitors, each carrying an electric charge corresponding to the light intensity of a pixel. A control circuit causes each capacitor to transfer its contents to its neighbor, and the last capacitor in the array dumps its charge into a charge amplifier. The bucket-brigade style of data transfer is characteristic of CCD sensors. In contrast, a CMOS image sensor has a photodiode and a CMOS transistor switch for each pixel, allowing the pixel signals to be amplified individually. By operating the matrix of switches, the pixel signals can be accessed directly and sequentially, and at a much higher speed than a CCD sensor. Having an amplifier for each pixel also gives another advantage: it reduces the noise that occurs when reading the electrical signals converted from captured light.

Figure 3A:
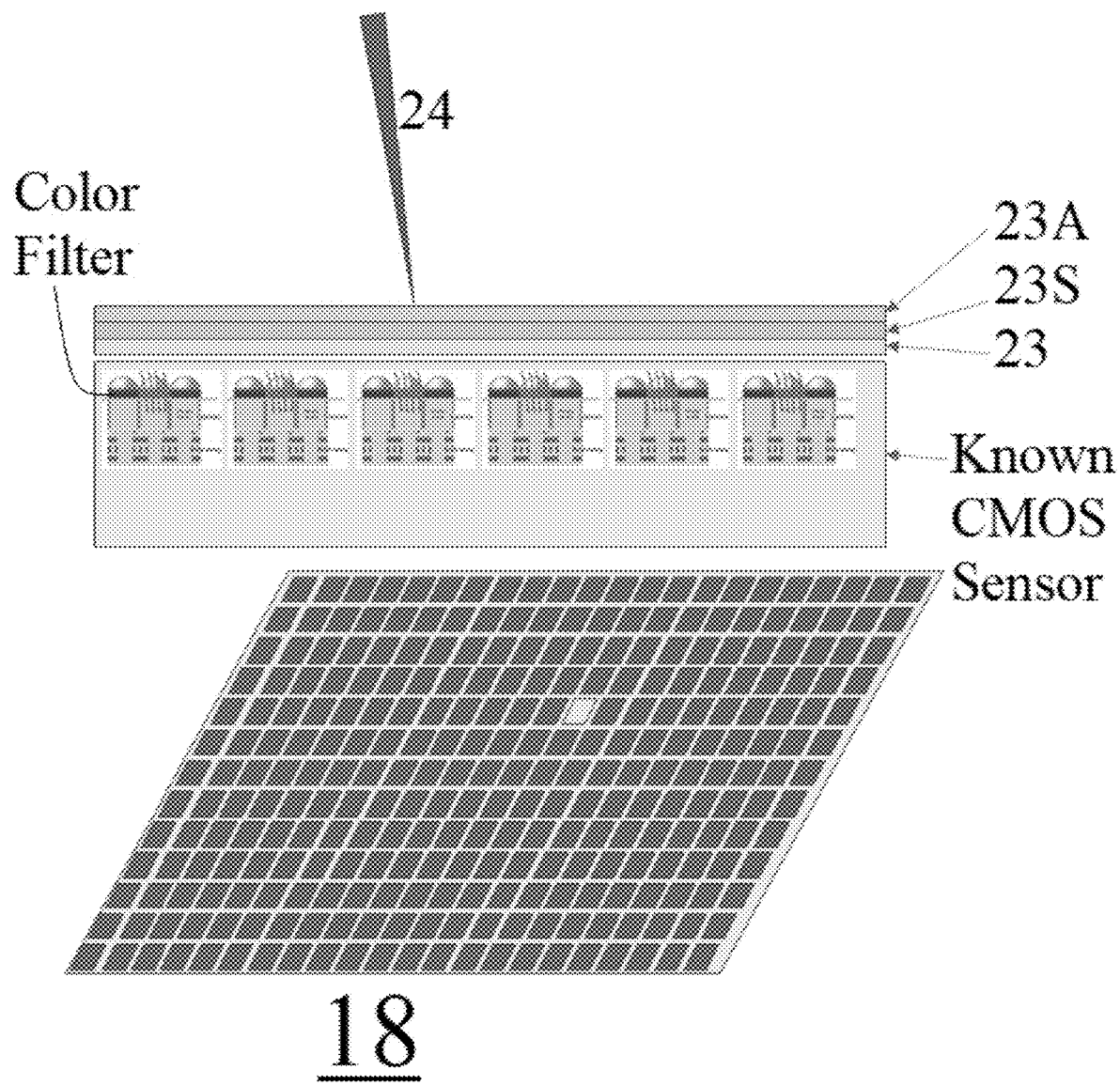
FIG. 3A schematically illustrates a digital detector based on CMOS pixel structure in accordance with an exemplary embodiment of the present invention.
Figure 3B:
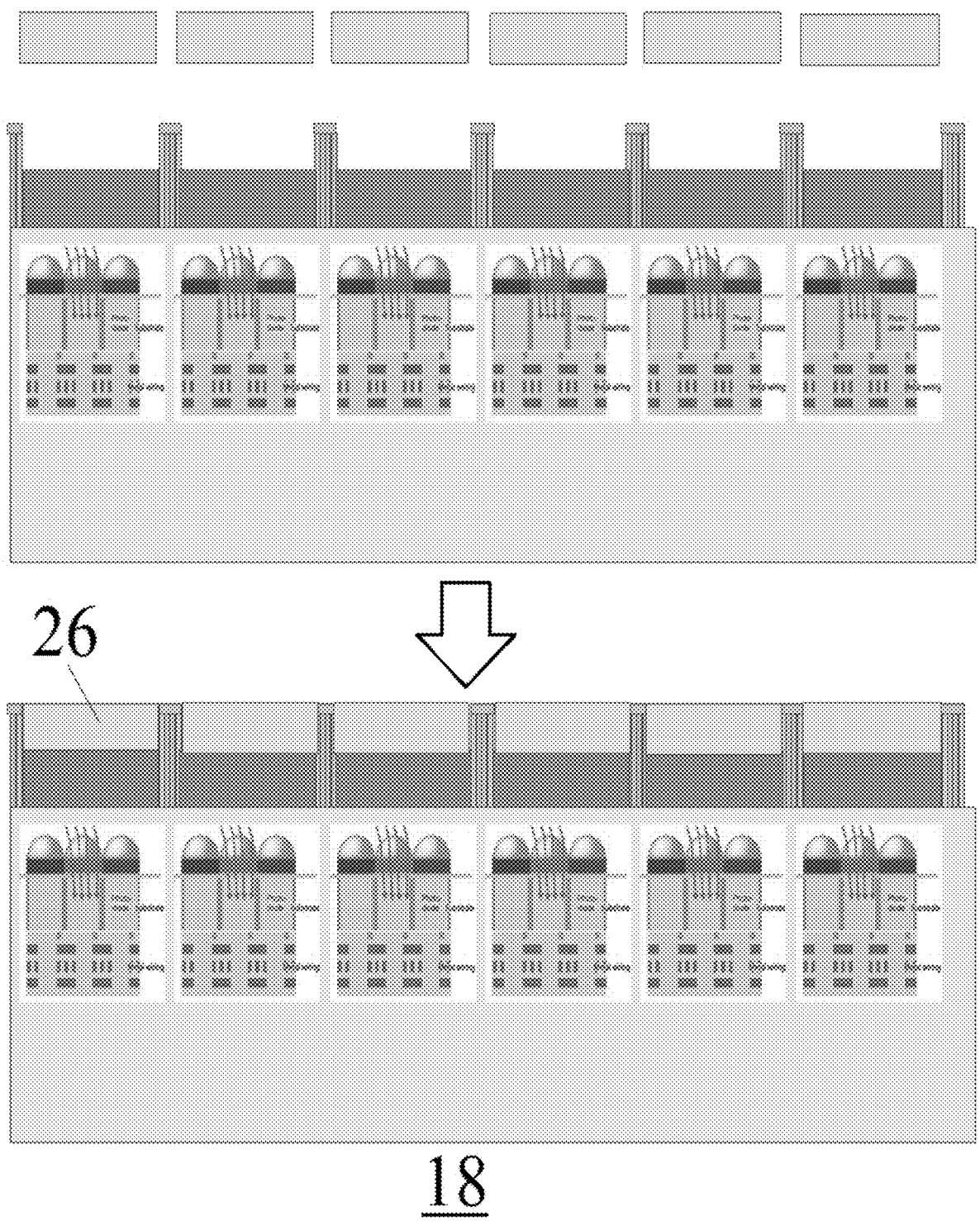
FIG. 3B schematically illustrates an improved digital detector based on CMOS pixel structure in accordance with an exemplary embodiment of the present invention.

FIG. 3A and FIG. 3B illustrate a digital detector 18 with array of pixels based on CMOS image sensor. The embodiment uses current CIS pixel to identify electron beam position and spot size. High energy beam 24 will pass through an aluminum layer 23A to avoid charging and a SiN or SiO2 protection layer 23S with a thickness of around 50~100 nm, and then stimulate fluorescent material layer 23 to emit light. The emitted light is then captured by the known CMOS senor structure. The layer of conversion material 23 may be continuous and undivided as shown in FIG. 3A, or it may be divided into blocks 26 with separation walls as shown in FIG. 3B. CIS pixel will receive light directly and output light signal as an image. Beam position with CIS sensor pixel size accuracy can then be detected based on the image. Fabrication of a CMOS sensor is well known in the art, and will not be described in details.

Figure 4:
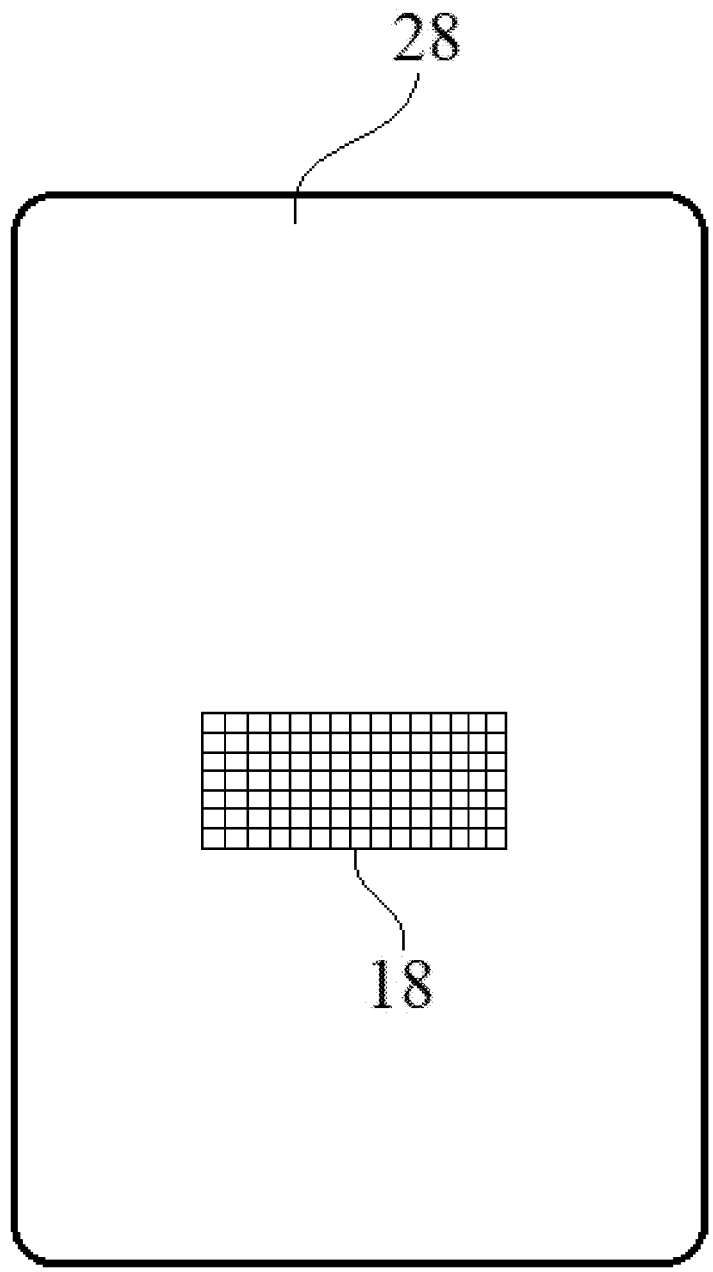
FIG. 4 schematically illustrates a general electronic apparatus/device using a digital detector for detecting X-ray, UV light or charged particles in accordance with an exemplary embodiment of the present invention.

The present invention further provides a general optoelectronic apparatus/device 28 that comprises one or more digital detectors 18, as illustrated in FIG. 4. Examples of apparatus/device 28 include, but are not limited to, a digital imager, x-ray detector, an analytical instrument, and an apparatus of charged-particle beam such as electron microscope and an electron beam lithographical apparatus.

Figure 5:
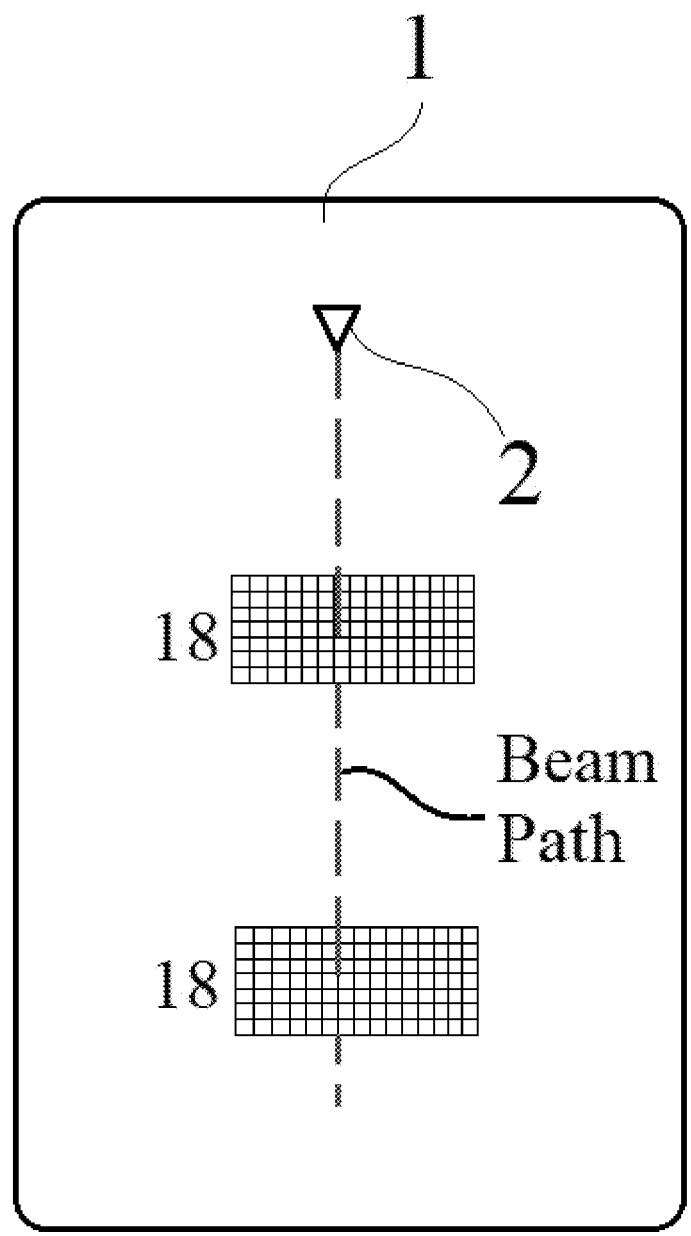
FIG. 5 schematically illustrates an apparatus of charged-particle beam using a digital detector for detecting charged particles in accordance with an exemplary embodiment of the present invention.

In a preferred embodiment, the general optoelectronic apparatus/device 28 is an apparatus of charged-particle beam 1 as shown in FIG. 5. One or more digital detectors 18 are removably inserted or placed in the charged-particle beam path, or the trajectory of the charged-particle beam. The one or more digital detectors 18 may be used for (1) monitoring the size, shape, intensity distribution of the charged-particle beam spot, (2) monitoring the beam position and beam angle, (3) monitoring variations of said size, shape, intensity distribution, beam position and beam angle as a function of time, (4) aligning the beam's position and/or beam angle based on the results as monitored from (1)-(3); and (5) optimizing system performance of the apparatus of charged-particle beam 1.

Figure 6A:
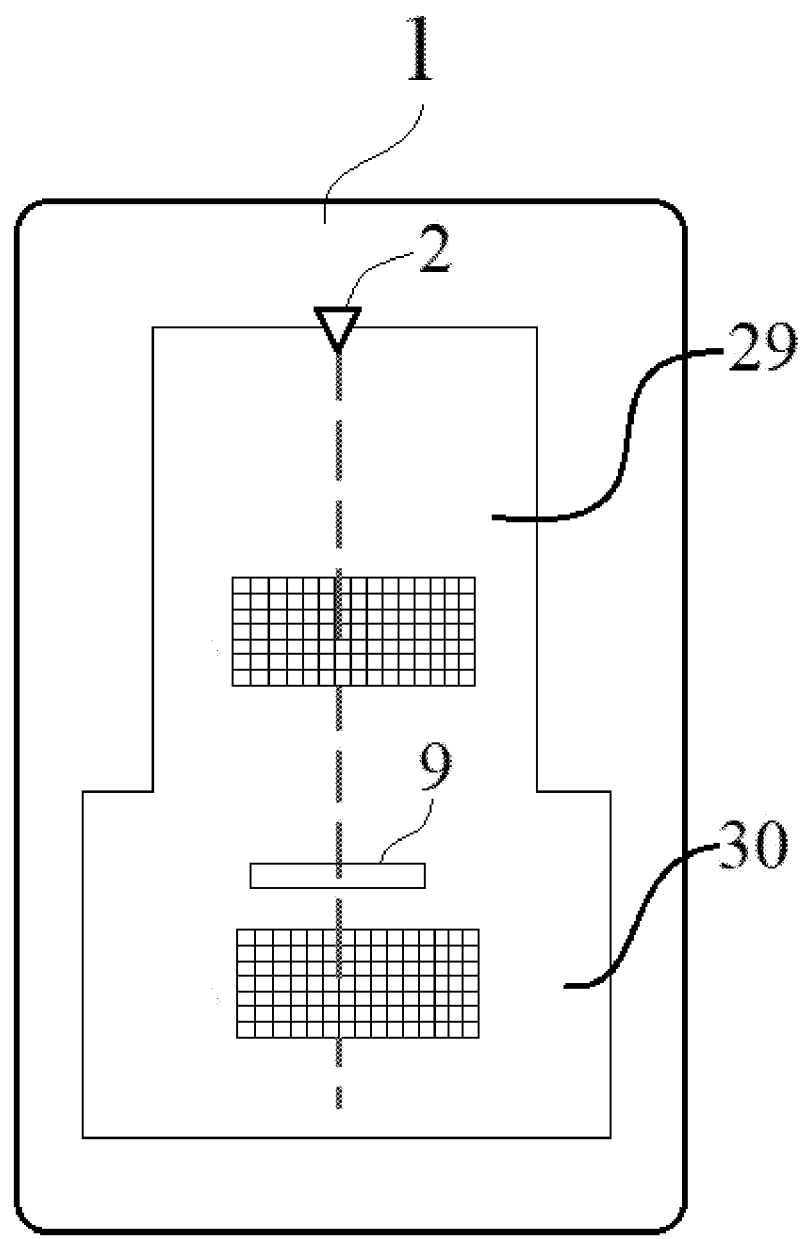
FIG. 6A illustrates a charged-particle optical column and a sample chamber in an apparatus using a digital detector for detecting charged particles in accordance with an exemplary embodiment of the present invention.
Figure 19:
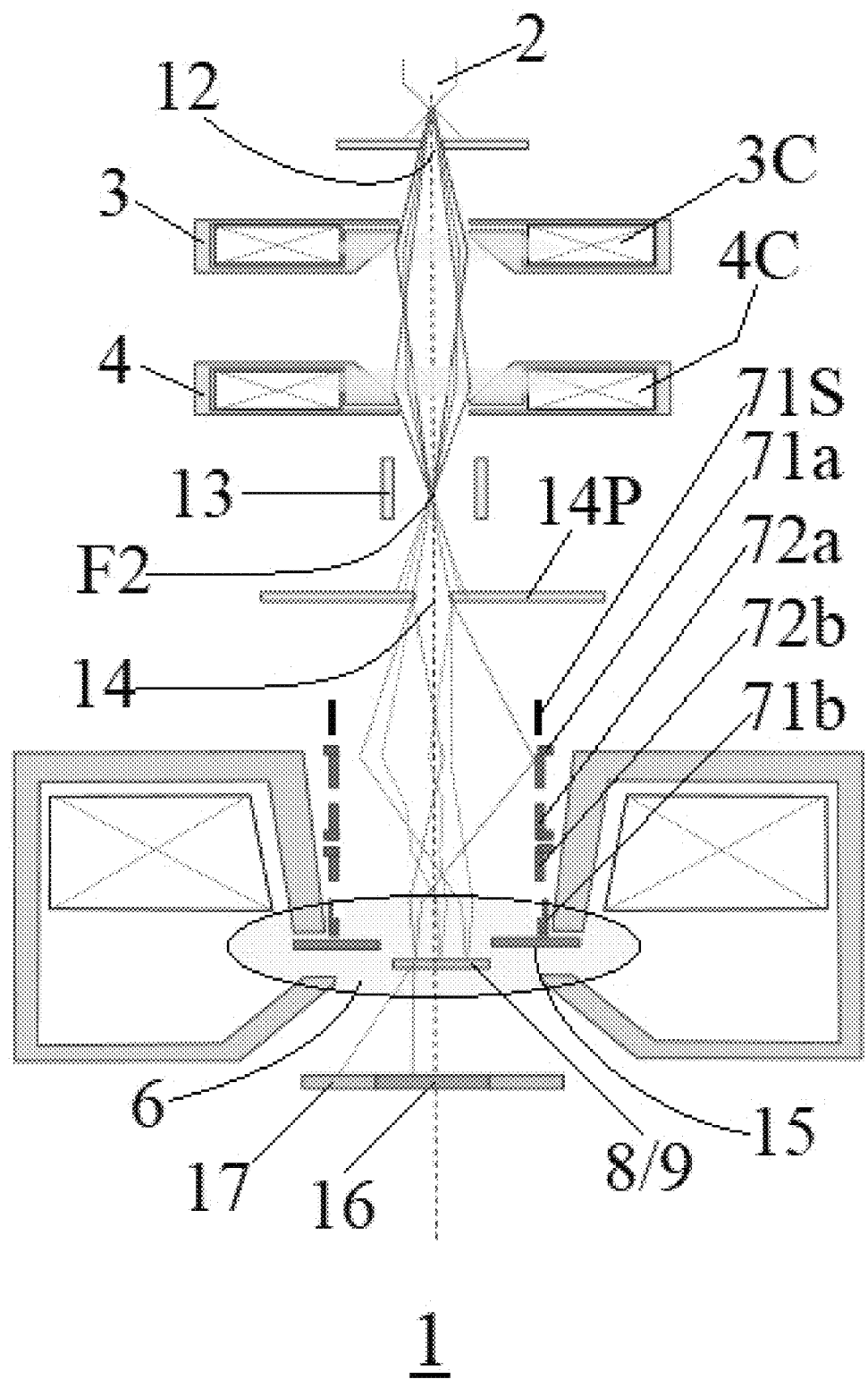
FIG. 19 shows an apparatus of charged-particle beam which can be used with a digital detector in accordance with an exemplary embodiment of the present invention.

In some embodiments, the apparatus of charged-particle beam 1 may include a charged-particle optical column 29 and a sample chamber 30, as shown in FIG. 6A. The one or more digital detectors 18 are insertable to (or can be affixed to) any place inside the charged-particle optical column 29 and/or the sample chamber 30. For example, the charged-particle optical column 29 may include one or more charged-particle optical components along the beam path, selected from a source of charged particles configured to emit a beam of charged particles such as an electron gun 2 configured to emit an electron beam, condenser(s), stigmator(s), alignment coil(s), alignment plate(s), beam blanking(s), plate(s) with objective (or limiting) aperture(s), plate(s) with spread aperture(s), deflector(s), magnetic objective lens(es), and detector(s). The sample chamber 30 may include one or more chamber components selected from a specimen holder 9 for holding a specimen under examination, a receptacle for receiving a lithographical workpiece (e.g. mask or wafer) being processed with the beam, and a detector for detecting charged particles. In preferred embodiments, the one or more digital detectors 18 are affixed to one or more movable parts selected from the charged-particle optical components and the chamber components. As shown in FIG. 19, charged-particle optical components within the column 29 may be electron optical components selected from the following (from upstream to downstream): an electron gun 2 configured to emit an electron beam, a first co-condenser 3, a second co-condenser 4, a beam blanking 13, a plate 14P with an objective aperture 14, a stigmator 71$s$, an upper macroscopic deflector 71$a$, an upper microscopic deflector 72$a$, a lower microscopic deflector 72$b$, a lower macroscopic deflector 71$b$, a magnetic objective lens 6, and a BSE or SE detector 15.

Figure 6B:
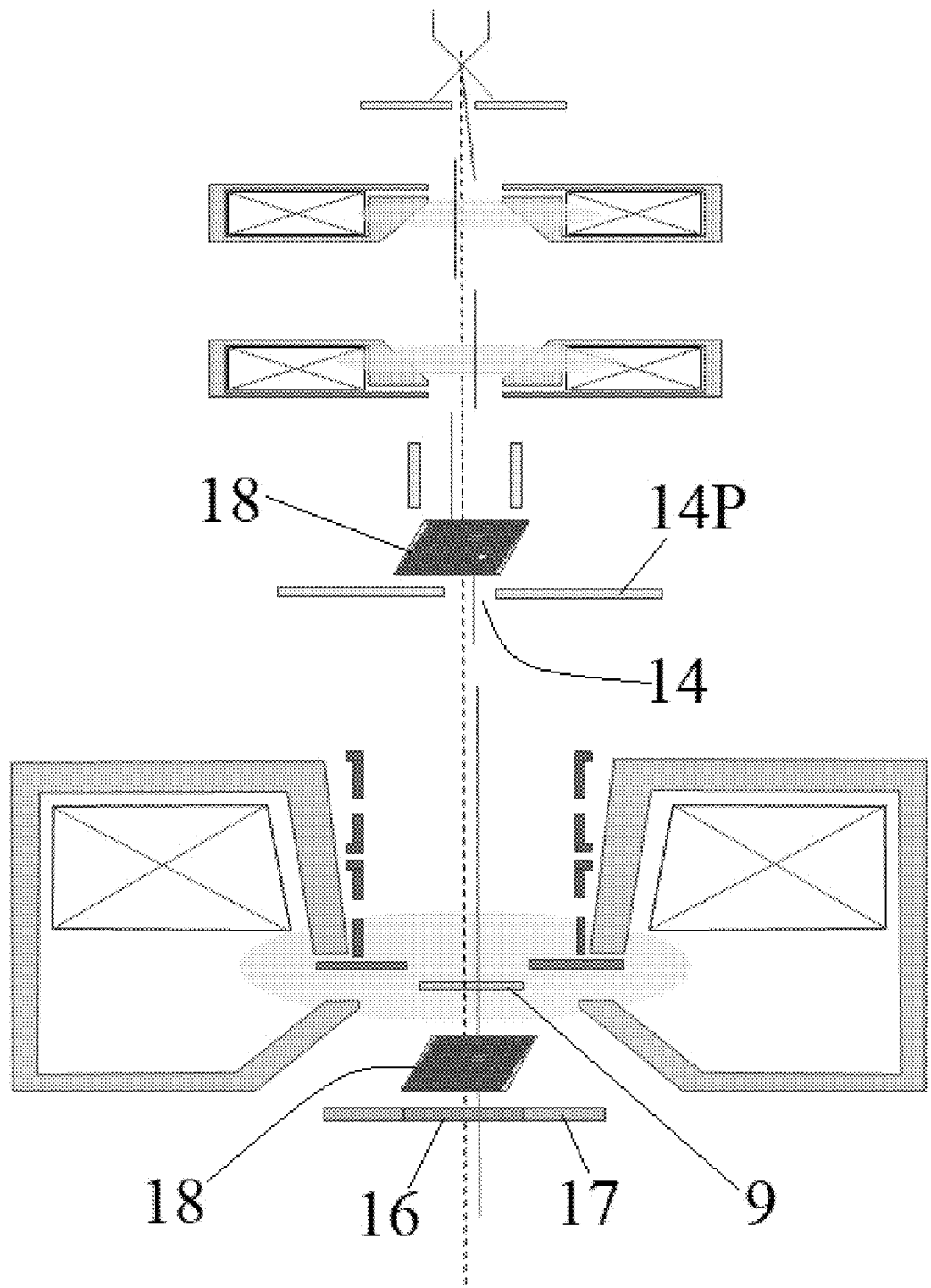
FIG. 6B schematically illustrates an electron microscope using a digital detector for detecting electron beam in accordance with an exemplary embodiment of the present invention.
Figure 7:
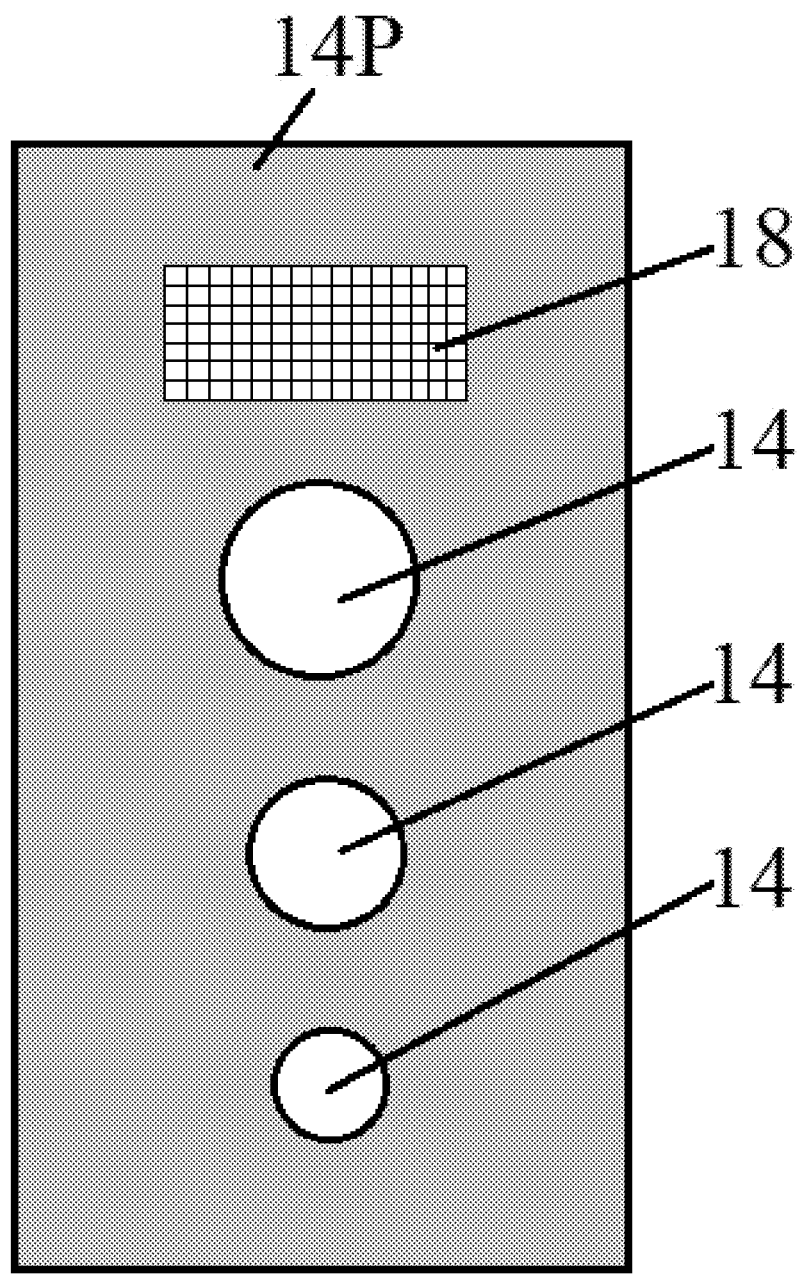
FIG. 7 schematically illustrates an electron microscope in which a digital electron beam detector is removably affixed next to an objective aperture in accordance with an exemplary embodiment of the present invention.
Figure 8:
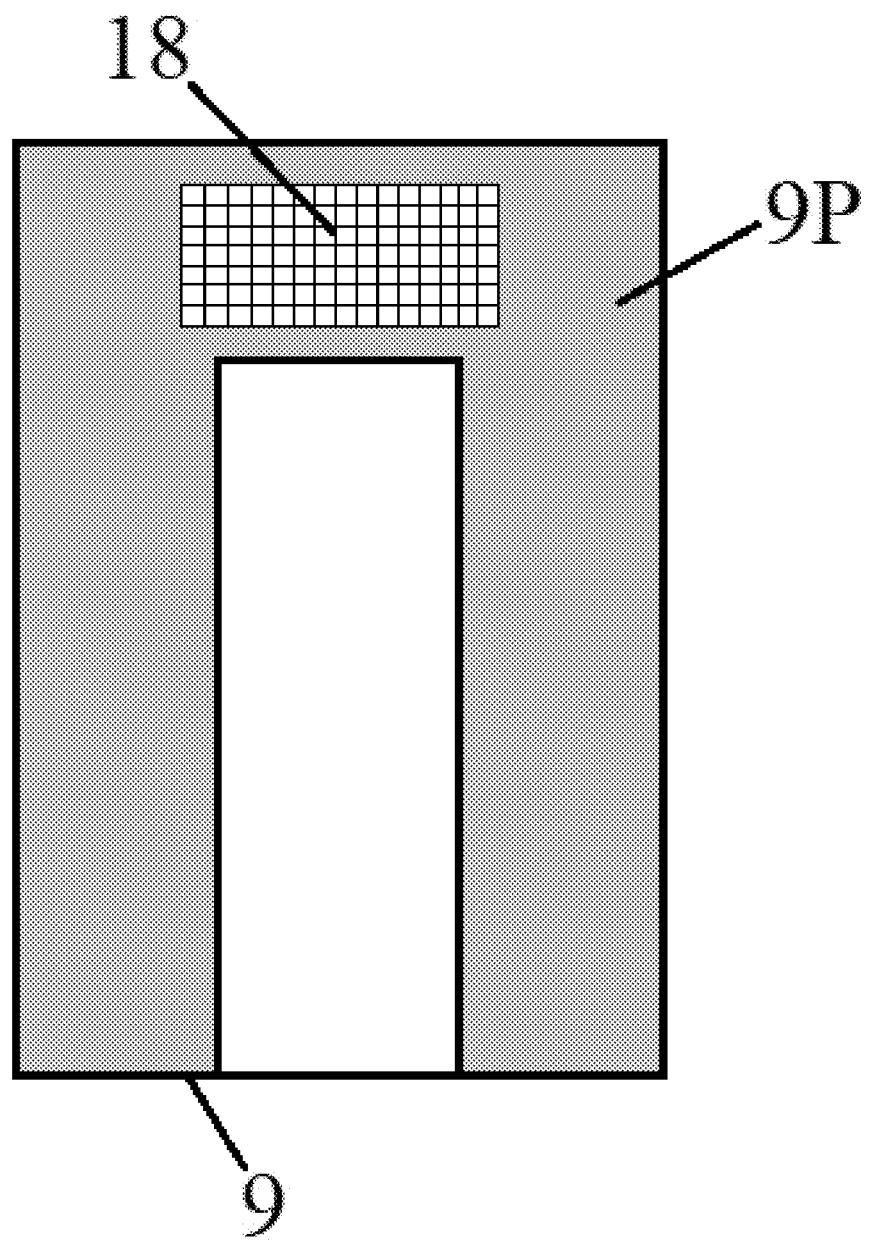
FIG. 8 schematically illustrates an electron microscope in which a digital electron beam detector is removably affixed to a sample holder in accordance with an exemplary embodiment of the present invention.

In preferred embodiments, the apparatus of charged-particle beam 28/1 is an electron microscope (such as STEM), or an electron beam lithography apparatus. Referring to FIG. 6B, smaller new CIS sensor 18 of the invention having a size such as 6 mm×6 mm×2 mm can be put in EM vacuum system directly to detect beam position. The operator can move in and out the sensor 18 like he/she changes aperture 14. The operator can install new CIS sensor 18 at different position for different alignment purpose. For example, one of the digital detectors 18 may be removably placed/affixed onto a plate 14P with the objective aperture 14. Such a plate 14P may include one, two or more objective apertures 14 with different sizes, as illustrated in FIG. 7. Alternatively or additionally, one of the digital detectors 18 may be removably placed/affixed onto a peripheral area 9P of the specimen holder 9, as illustrated in FIG. 8. Alternatively or additionally, one of the digital detectors 18 may be removably placed/affixed between the specimen holder 9 and BF/DF detectors (16, 17). By putting new CIS sensor 18 in column and directly detecting beam position and spot size, the operator can align each parts quickly.

Figure 9:
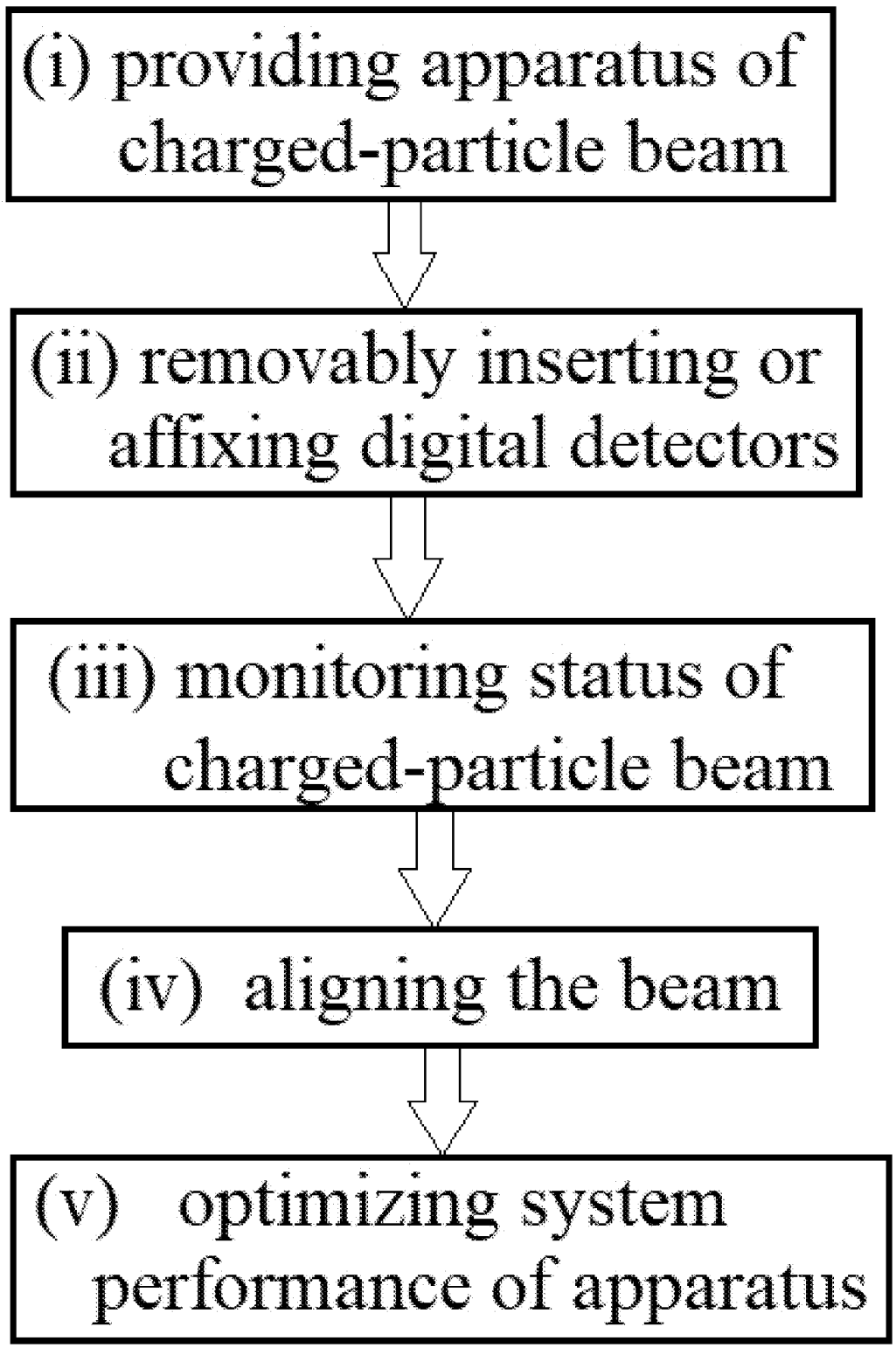
FIG. 9 is a flow chart showing a method of optimizing system performance of an apparatus of charged-particle beam with a digital detector in accordance with an exemplary embodiment of the present invention.

A further aspect of the present invention provides a method of optimizing system performance of an apparatus of charged-particle beam, as shown in FIG. 9. Referring to FIG. 9, step (i) is related to providing an apparatus of charged-particle beam comprising a charged-particle optical column (such as an electron optical column) and a sample chamber. Step (ii) is removably inserting/affixing one or more digital detectors as described above onto one or more charged-particle optical components (such as electron optical components) within the column and/or chamber components within the sample chamber. Step (iii) is monitoring (1) the size, shape, intensity distribution of the charged-particle beam spot, (2) the beam position and beam angle, and (3) variations of said size, shape, intensity distribution, beam position and beam angle as a function of time, using one or more digital detectors 18. Step (iv) is aligning the beam's position and/or beam angle based on the results as monitored from (1)-(3) in step (iii). Finally, step (v) is optimizing system performance of the apparatus of charged-particle beam based on the results as monitored from (1)-(3) in step (iii). In a preferred embodiment, step (ii) is carried out by removably inserting/affixing one of the digital detectors 18 onto a plate 14P with at least one objective aperture 14 in the charged-particle optical column. In another preferred embodiment, step (ii) is executed by removably inserting/affixing one of the digital detectors 18 onto a peripheral area of a specimen holder in the sample chamber.

Figure 10:
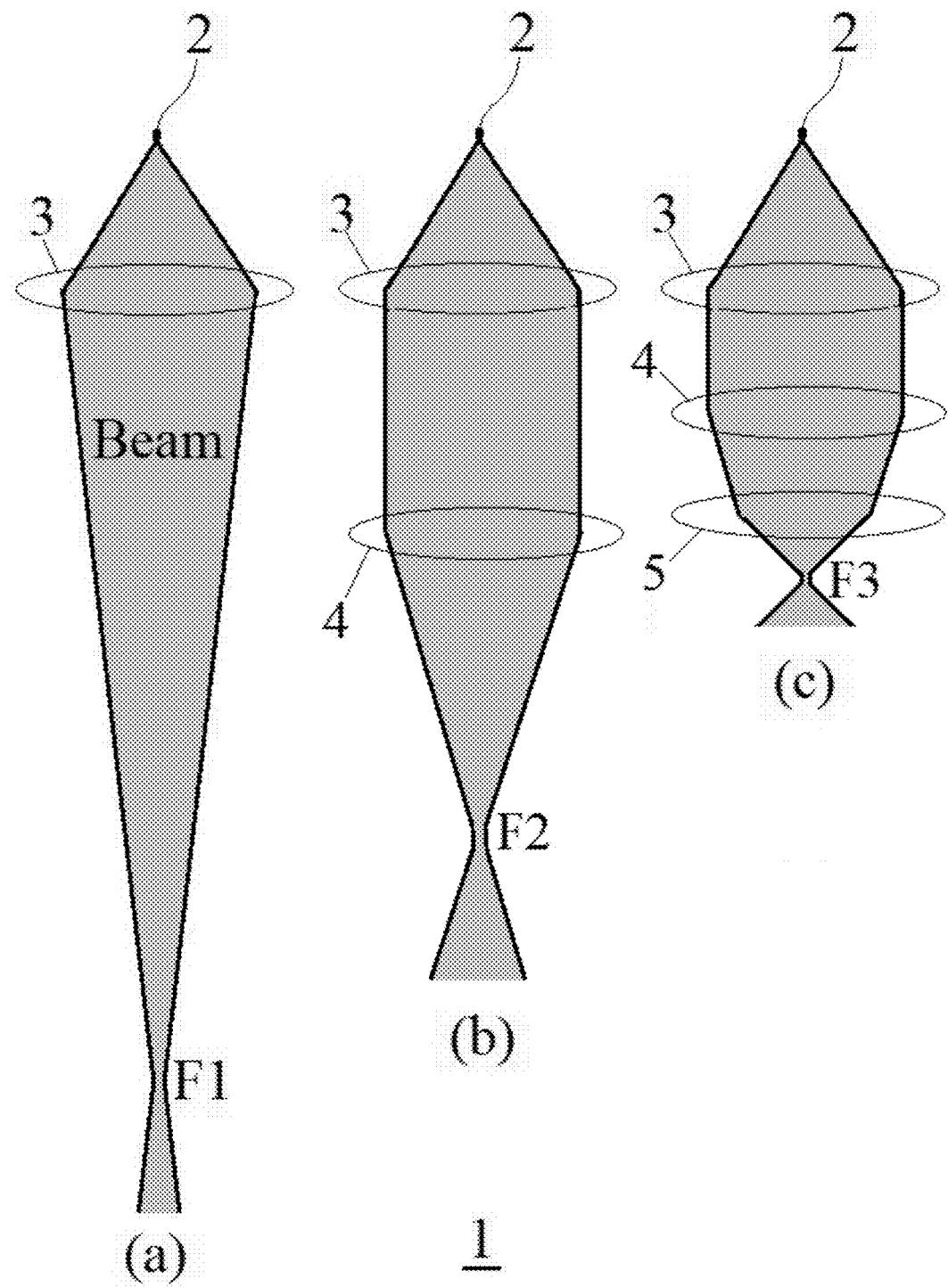
FIG. 10 schematically illustrates the formation of co-condensers which can be used in an apparatus of charged-particle beam with a digital detector in accordance with an exemplary embodiment of the present invention.
Figure 11:
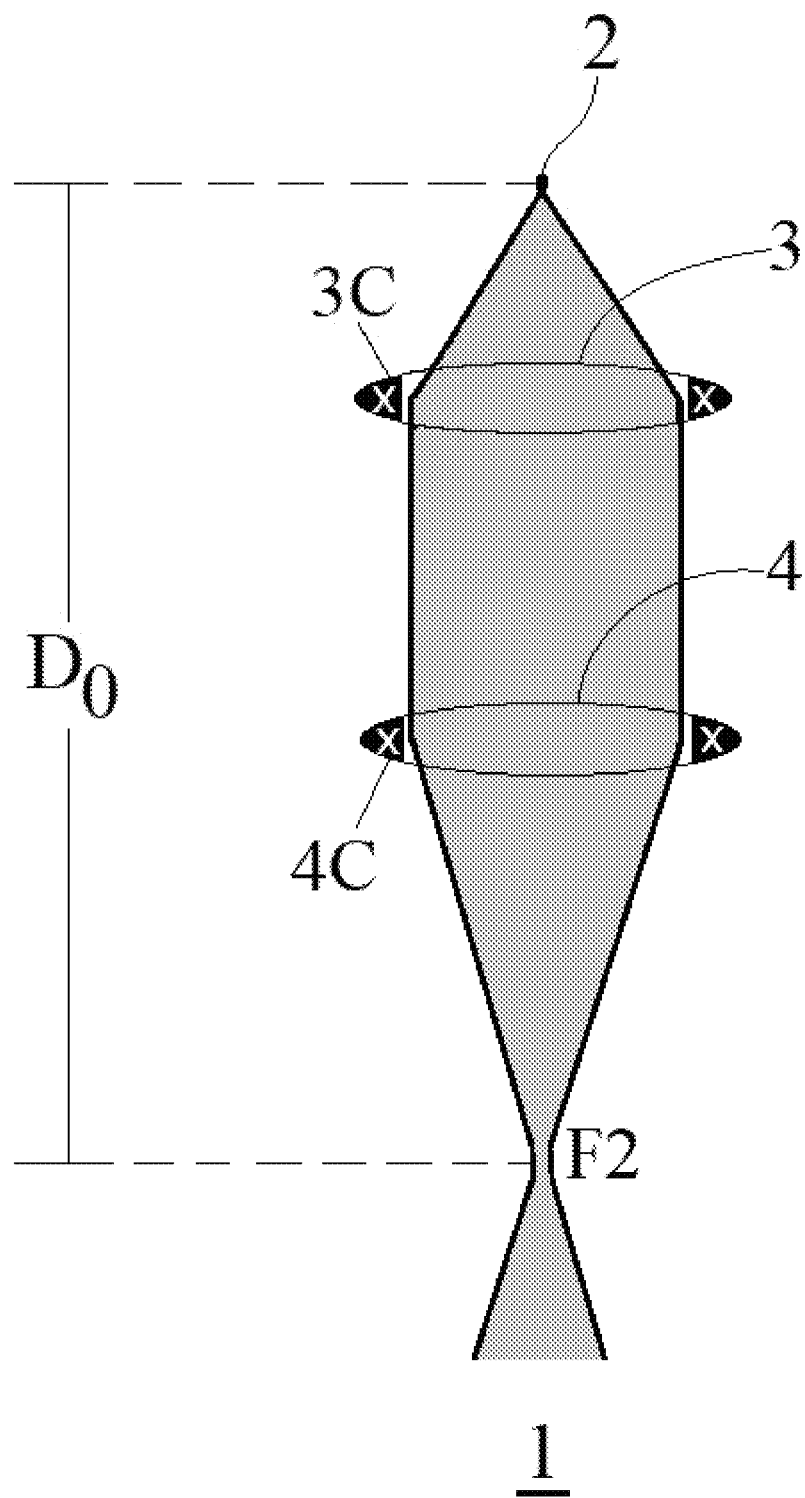
FIG. 11 shows two co-condensers with magnetic coils which can be used in an apparatus of charged-particle beam with a digital detector in accordance with an exemplary embodiment of the present invention.

In the following exemplary embodiments, the digital detector 10 of the invention will be used to optimize an apparatus of charged-particle beam having con-condensers as shown in FIGS. 10-11.

In an apparatus of charged-particle beam such as an electron microscope (e.g. STEM), the manipulation of an electron beam is performed using two physical effects. The interaction of electrons with a magnetic field will cause electrons to move according to the left-hand rule, thus allowing for electromagnets to manipulate the electron beam. The use of magnetic fields allows for the formation of a magnetic lens of variable focusing power, and the lens shape is determined by the distribution of magnetic flux. Electrostatic fields can cause the electrons to be deflected through a constant angle. Coupling of two deflections in opposing directions with a small intermediate gap allows for the formation of a shift in the beam path. From these two effects, as well as the use of an electron imaging system, sufficient control over the beam path is made possible. The lenses in the beam path can be enabled, tuned, and disabled entirely and simply via rapid electrical switching, the speed of which is only limited by effects such as the magnetic hysteresis.

In an apparatus 1 of charged-particle beam as shown in FIG. 10, a source 2 of charged particles is configured to emit a beam of charged particles. The source 2 may be for example an electron gun with a tungsten filament or a lanthanum hexaboride (LaB$_6$). In panel (a), a magnetic condenser 3 alone can focus the beam to a crossover spot F1. The beam is expanded after a crossover spot. In panel (b), another magnetic condenser 4 is placed between magnetic condenser 3 and crossover spot F1, and the beam is now focused to a new crossover spot F2 that is closer to source 2 than spot F1. In panel (c), a third magnetic condenser 5 is placed between magnetic condenser 4 and crossover spot F2, and the beam is again focused to another new crossover spot F3 that is even closer to source 2 than spot F2.

Generally, a condenser lens forms an image of the primary electron beam source for an objective lens, and the objective lens focuses the condenser lens image onto a specimen. Transmitted, secondary and backscattered electrons are released from the specimen material. These electrons are detected, amplified and the resulting signal used to modulate the beam of an imaging system operating synchronously with the scanning electron beam. The result is an image of the scanned area based on the electrons emitted or scattered from the specimen.

In the present invention, the term "co-condensers" is defined as two or more magnetic condensers configured to coherently focus the beam to a single crossover spot F. For example, magnetic condensers 3 and 4 in panel (b) coherently focus the beam to a single crossover spot F2, and they may be called a set of co-condensers. Magnetic condensers 3, 4 and 5 in panel (c) coherently focus the beam to a single crossover spot F3, and they may also be called a set of co-condensers. As shown in FIG. 10, the beam does not have any crossover spot between any two of the two or more magnetic condensers within a set of co-condensers.

The crossover spot F may be movable or immovable. In some embodiments of the invention, the single crossover spot F is so controlled that it remains stationary or immovable relative to the source 2 of charged particles. For example, crossover spot F2 may be kept stationary relative to the source 2, i.e. the distance DO between spot F2 and source 2 remains unchanged. By the same token, crossover spot F3 may be kept stationary relative to the source 2, i.e. the distance DO between spot F3 and source 2 remains unchanged.

While the single crossover spot F remains immovable relative to the source 2 of charged particles, the size A of the beam at crossover spot F (i.e. the cross-sectional area of the beam at F) may be so controlled to have a desired value. Preferably, size A may be tuned/adjusted by concertedly tuning/adjusting the individual condensing capacity of the two or more magnetic condensers within a set of co-condensers. For example, the condensing capacity of condenser 3 and that of condenser 4 may be individually but concertedly tuned/adjusted so that not only the single crossover spot F2 is fixed relative to the source 2, but also the size A of the beam at crossover spot F2 is controlled to have a value as desired. Likewise, the condensing capacities of two or more condensers 3, 4 and 5 may be individually but concertedly tuned/adjusted so that not only the single crossover spot F3 is fixed relative to the source 2, but also the size A of the beam at crossover spot F3 is controlled to have a value as desired. The two or more co-condensers are therefore configured to coherently focus the beam to the same cross-over point with different magnification rates.

Although the apparatus 1 may include one, two or more sets of co-condensers, in some preferred embodiments of the invention, the apparatus 1 includes only one set of co-condensers with only two magnetic condensers configured to coherently focus the beam to a single crossover spot F. For example, the apparatus 1 may include only one set of co-condensers as shown in Panel (b) of FIG. 10 with only two magnetic condensers (3, 4) configured to coherently focus the beam to a single crossover spot F2.

Referring to FIG. 11, the only two magnetic condensers (3, 4) include a distal magnetic condenser 4 which is distal to the source 2, and a proximal magnetic condenser 3 that is located between the source 2 and the distal magnetic condenser 4. The proximal magnetic condenser 3 comprises a magnetic coil 3C driven by a coil current I1; and the distal magnetic condenser 4 comprises a magnetic coil 4C driven by a coil current I2. Generally, both coil currents I1 and I2 are greater than 0 (>0).

In preferred embodiments of the invention, coil currents I1 and I2 are configured to position single crossover spot F2 at a fixed position, i.e. maintain a predetermined distance DO from source 2. With the "Fixed F2" condition being met, the size A of the crossover spot F2 may be increased by increasing coil current I1 and/or decreasing coil current I2; and decreased by decreasing coil current I1 and/or increasing coil current I2. The size A of the crossover spot F2 will be minimized when coil current I1 reaches its minimal value while coil current I2 reaches its maximal value. The size A is maximized when coil current I2 reaches its minimal value while I1 reaches its maximal value. There is no special limitation on the maximized size A, it may be smaller than, equal to, or bigger than the size of the source 2.

Figure 12:
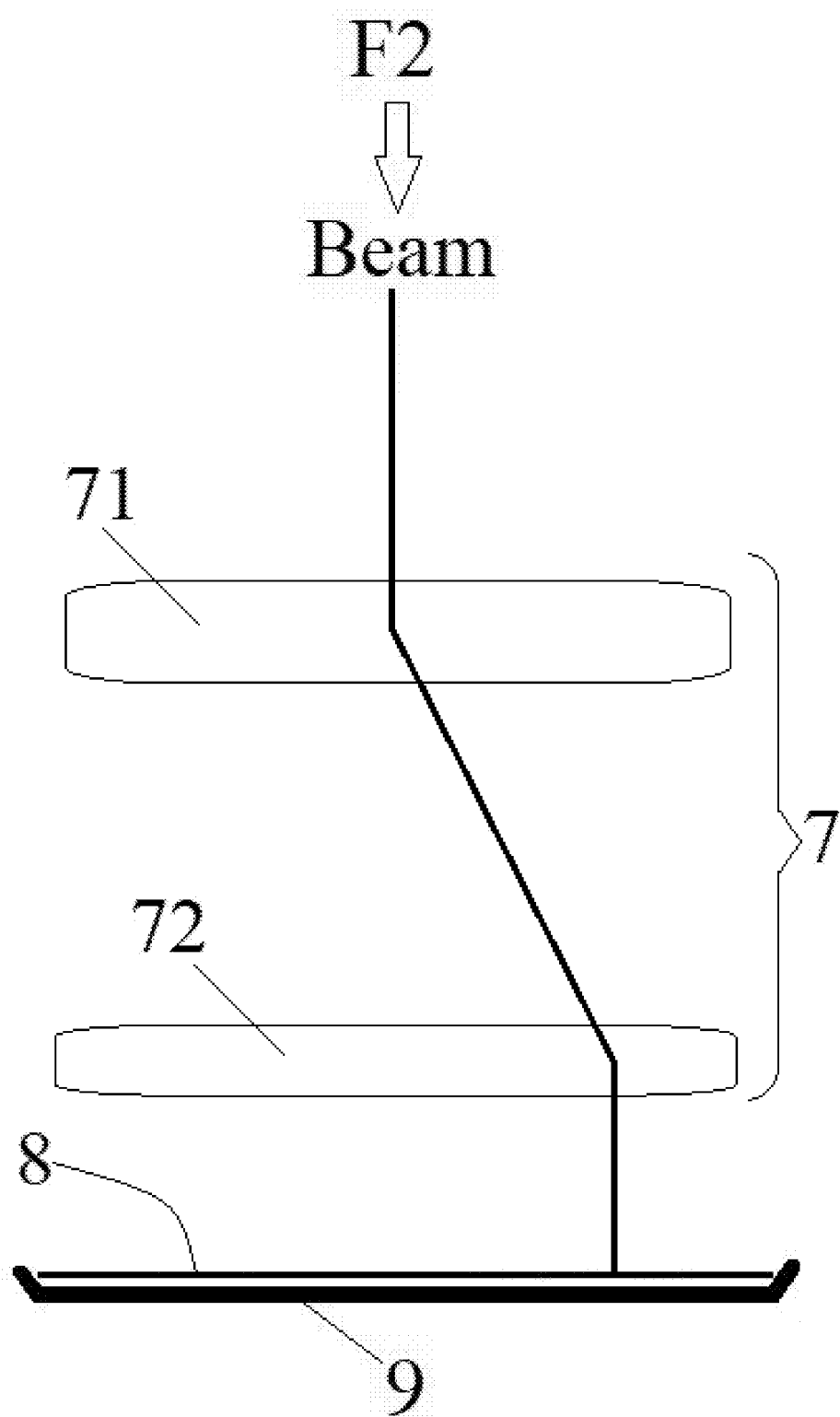
FIG. 12 illustrates an apparatus of charged-particle beam with a magnetic objective lens and a deflection system in accordance with an exemplary embodiment of the present invention.
Figure 17:
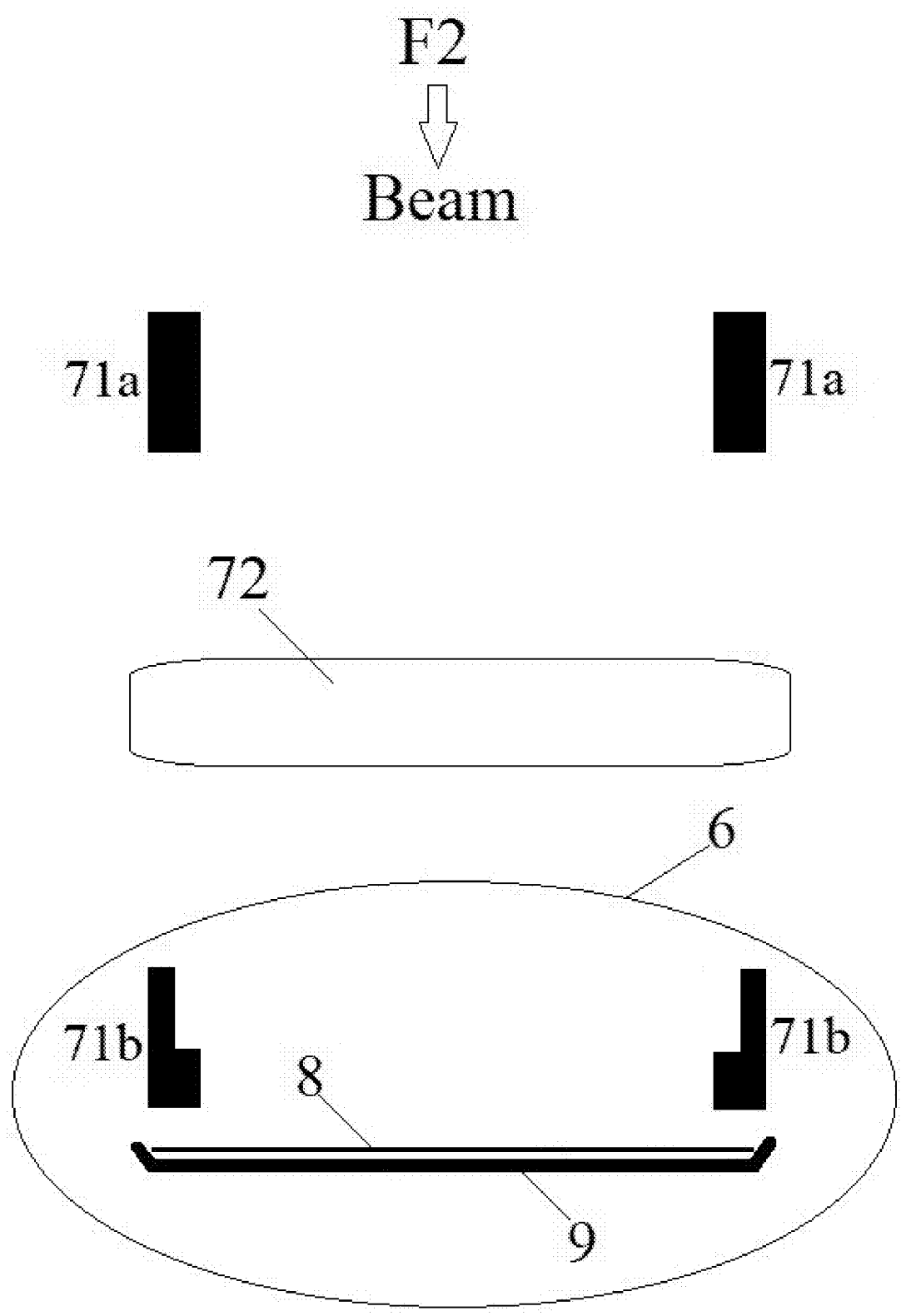
FIG. 17 schematically illustrates the configuration of a macroscopic deflection sub-system in accordance with an exemplary embodiment of the present invention.
Figure 18:
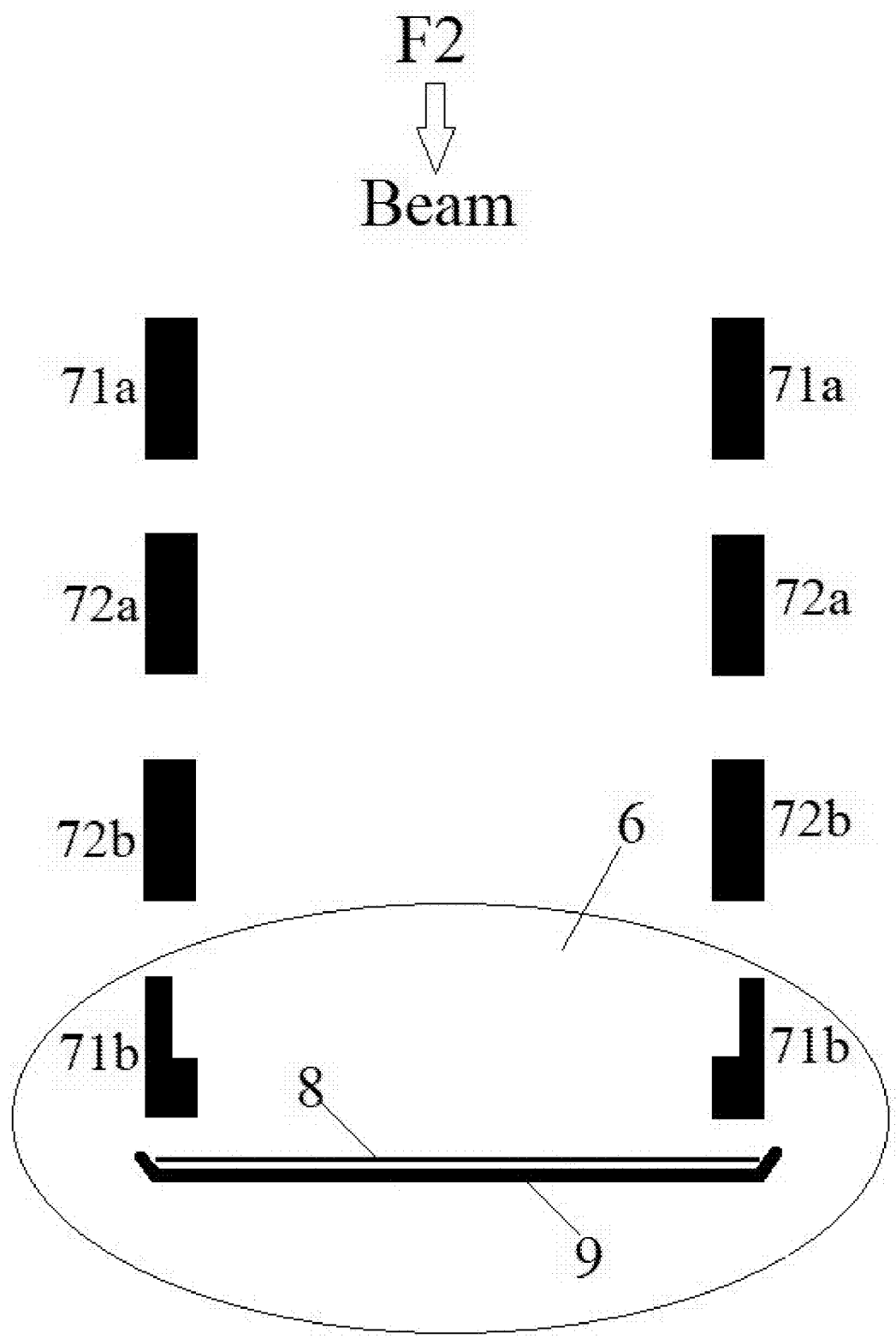
FIG. 18 schematically illustrates the configuration of a microscopic deflection sub-system in accordance with an exemplary embodiment of the present invention.

In various exemplary embodiments as shown in FIG. 12, the apparatus of charged-particle beam according to the invention may include a magnetic objective lens 6 (as shown in FIGS. 17-19) and a deflection system 7, both of which are downstream with respect to the single crossover spot F (e.g. F2). Although electron lenses may operate electrostatically or magnetically, most electron lenses use electromagnetic coils to generate a convex lens. The field produced for the lens is typically radially symmetrical, as deviation from the radial symmetry of the magnetic lens causes aberrations such as astigmatism and worsens spherical and chromatic aberration. For example, a quadrupole lens is an arrangement of electromagnetic coils at the vertices of the square, enabling the generation of a lensing magnetic fields, the hexapole configuration simply enhances the lens symmetry by using six, rather than four coils. Electron lenses may be manufactured from iron, iron-cobalt or nickel cobalt alloys, such as permalloy, due to their good magnetic properties, such as magnetic saturation, hysteresis and permeability. It should be appreciated that the objective lens 6 may be an electromagnetic lens or an electrostatic lens.

Objective lens 6 allows for electron beam convergence, with the angle of convergence as a variable parameter. The magnification may be simply changed by modifying the amount of current that flows through the coil of lenses. Lens 6 may include yoke, magnetic coil, poles, pole piece, and external control circuitry. An electromagnetic lens may include an upper pole piece and a lower pole piece. The pole piece must be manufactured in a very symmetrical manner, as this provides the boundary conditions for the magnetic field that forms the lens. Imperfections in the manufacture of the pole piece can induce severe distortions in the magnetic field symmetry, which induce distortions that will ultimately limit the lenses' ability to reproduce the object plane. The exact dimensions of the gap, pole piece internal diameter and taper, as well as the overall design of the lens is often performed by finite element analysis of the magnetic field, taking into account of the thermal and electrical constraints of the design. The coils which produce the magnetic field are located within the lens yoke. The coils can contain a variable current, but typically utilize high voltages, and therefore require significant insulation in order to prevent short-circuiting the lens components. Thermal distributors are placed to ensure the extraction of the heat generated by the energy lost to resistance of the coil windings. The windings may be water-cooled, using a chilled water supply in order to facilitate the removal of the high thermal duty.

A magnetic lens may include a magnetic material and exciting coils for providing magnetomotive force to a magnetic circuit having field lines through the magnetic material and between pole faces.

For the deflection system 7, it may include a macroscopic deflection sub-system 71 and a microscopic deflection sub-system 72. The deflection system 7 causes the beam to position at, and scan across, a large field of view (FOV) on a specimen plane 8 of a specimen under examination in a specimen holder 9 and one or more small FOVs within the large FOV.

Figure 13:
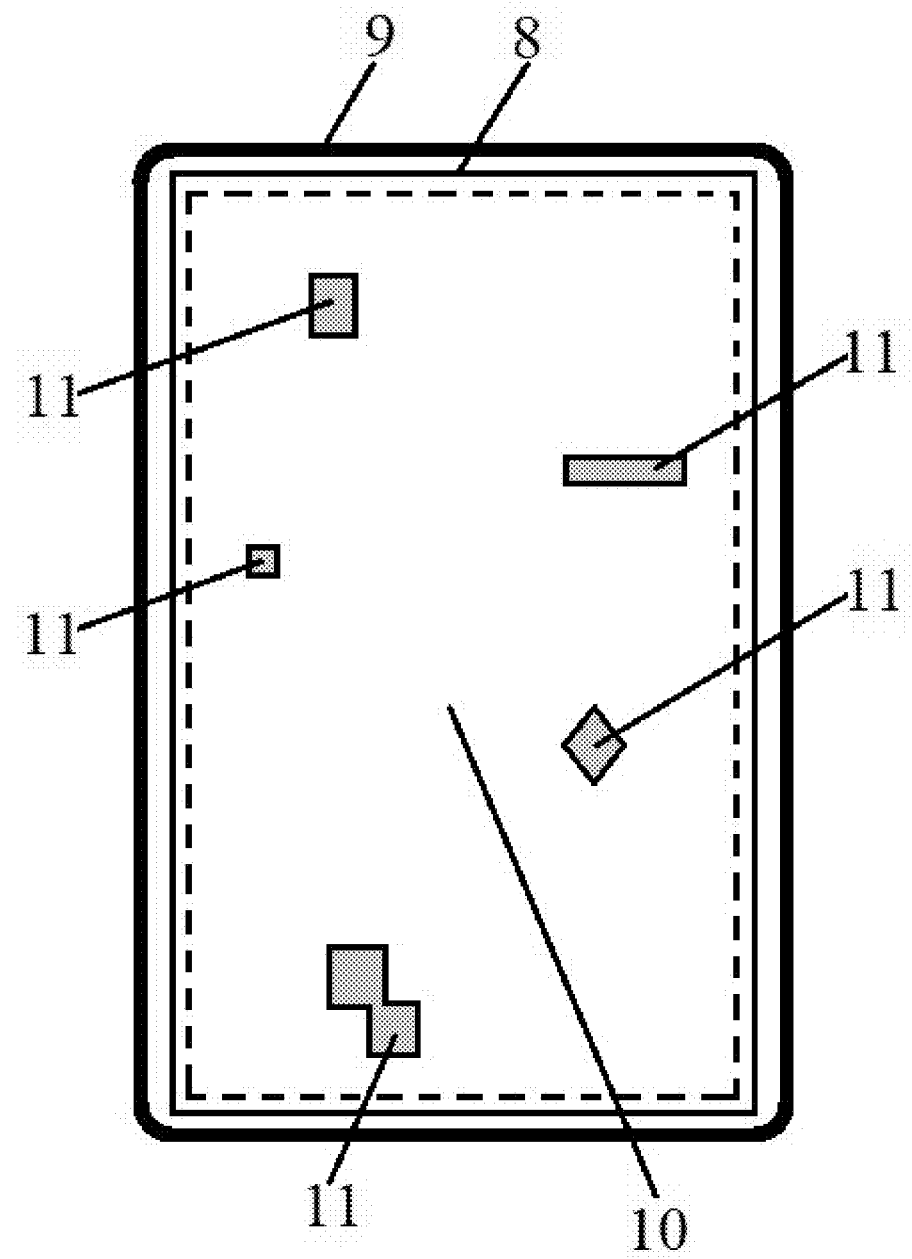
FIG. 13 demonstrates a single large field of view (FOV) on the specimen plane of the apparatus in accordance with an exemplary embodiment of the present invention.
Figure 14:
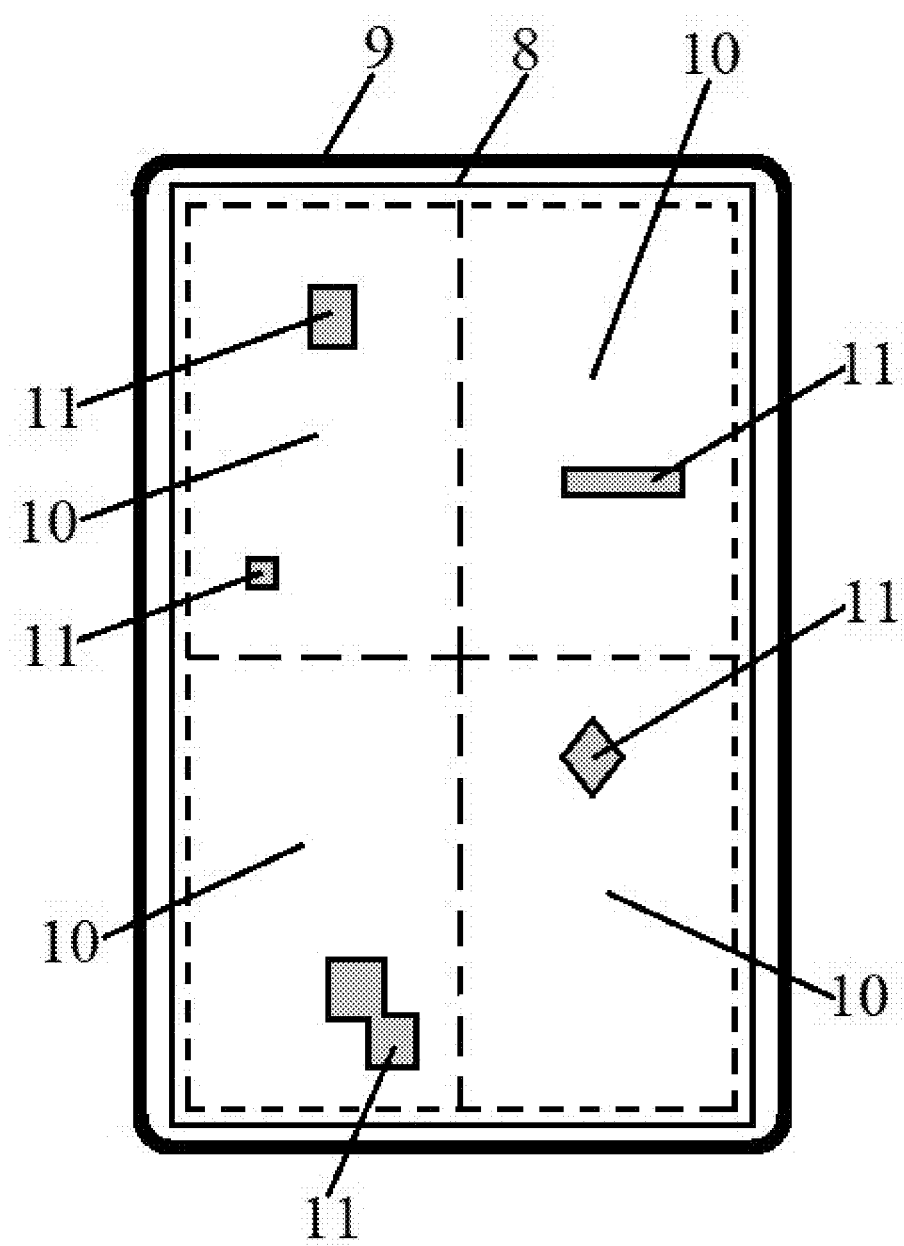
FIG. 14 demonstrates multiple large FOVs on the specimen plane of the apparatus in accordance with an exemplary embodiment of the present invention.

As shown in FIGS. 13 and 14, the macroscopic deflection sub-system 71 causes the beam to scan across a large field of view (FOV) 10 on the specimen plane 8 of the specimen holder 9, and the microscopic sub-deflection system 72 causes the beam to position at, and scan across, one or more small FOVs 11 within a large FOV. As shown in FIG. 13, the specimen plane 8 may contain only one large FOV 10, which may contain zero, one, two, three or more small FOVs 11. In FIG. 14, the specimen plane 8 may contain two, three or more large FOVs 10, each of which may contain zero, one, two, three or more small FOVs 11.

Figure 15:
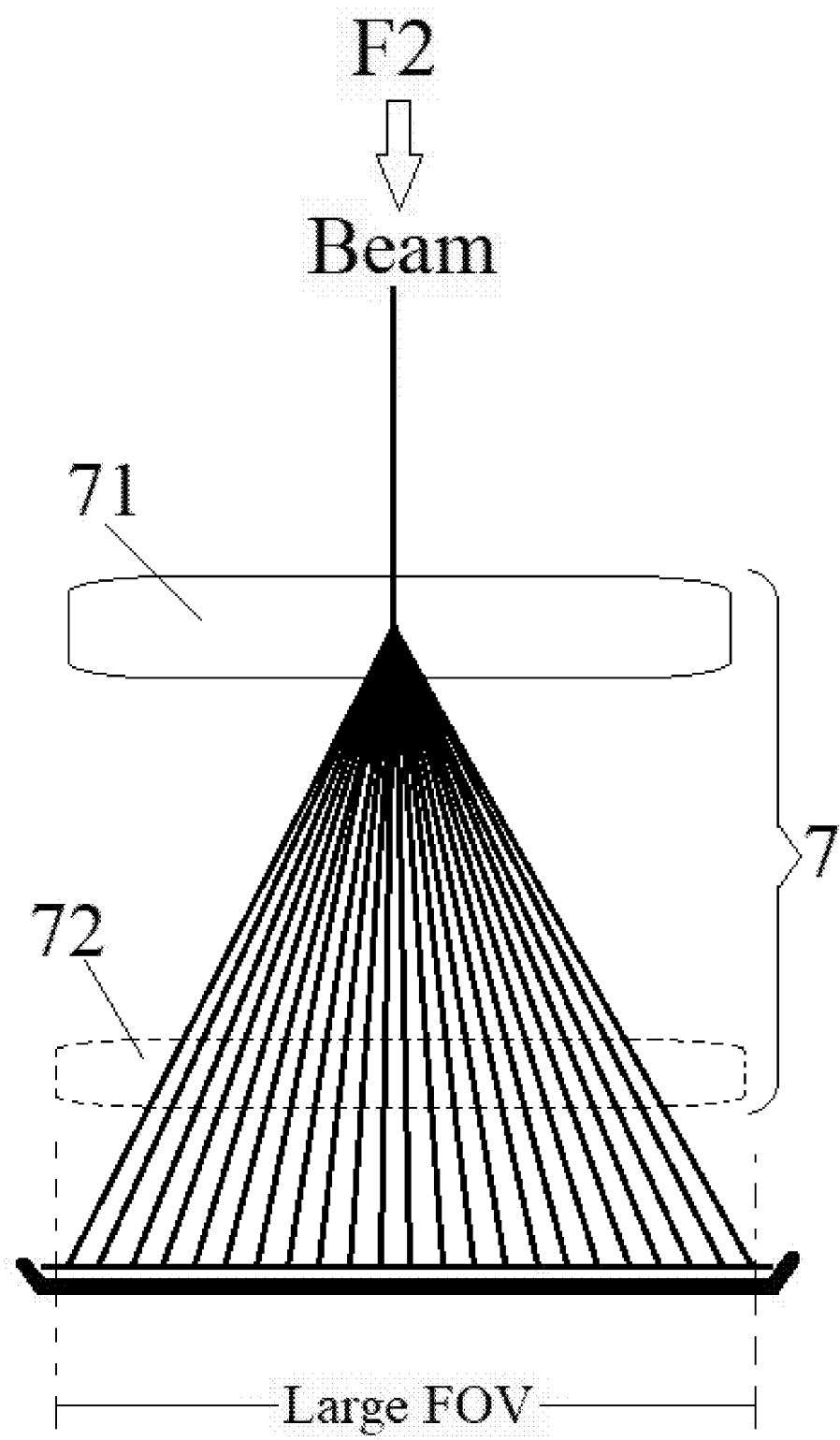
FIG. 15 illustrates a macroscopic deflection sub-system in accordance with an exemplary embodiment of the present invention that alone causes the beam to scan across a large FOV.

In the first step of an examination process as shown in FIG. 15, a user may turn off or inactivate the microscopic sub-deflection system 72. Then, the macroscopic deflection sub-system 71 causes the beam to scan across a large FOV 10 on the specimen plane 8 of the specimen holder 9 under a lower resolution (e.g. 10 nm). After the large FOV scanning is completed, the user finds a pattern of interesting (POI) in one or more small FOVs 11 within that large FOV 10, and the user will then zoom into the POI for further examination with a higher resolution (e.g. 1 nm). As an advantage of the present invention, the user will not need to mechanically move the specimen holder 9 to reposition or align the specimen plane 8 to the center of a target small FOV 11. In other words, the specimen holder 9 remains stationary relative to the source 2 of charged particles, no matter the beam is scanning across a given large FOV 10 or subsequently scanning across one, two or more small FOVs 11 within that large FOV 10.

Figure 16:
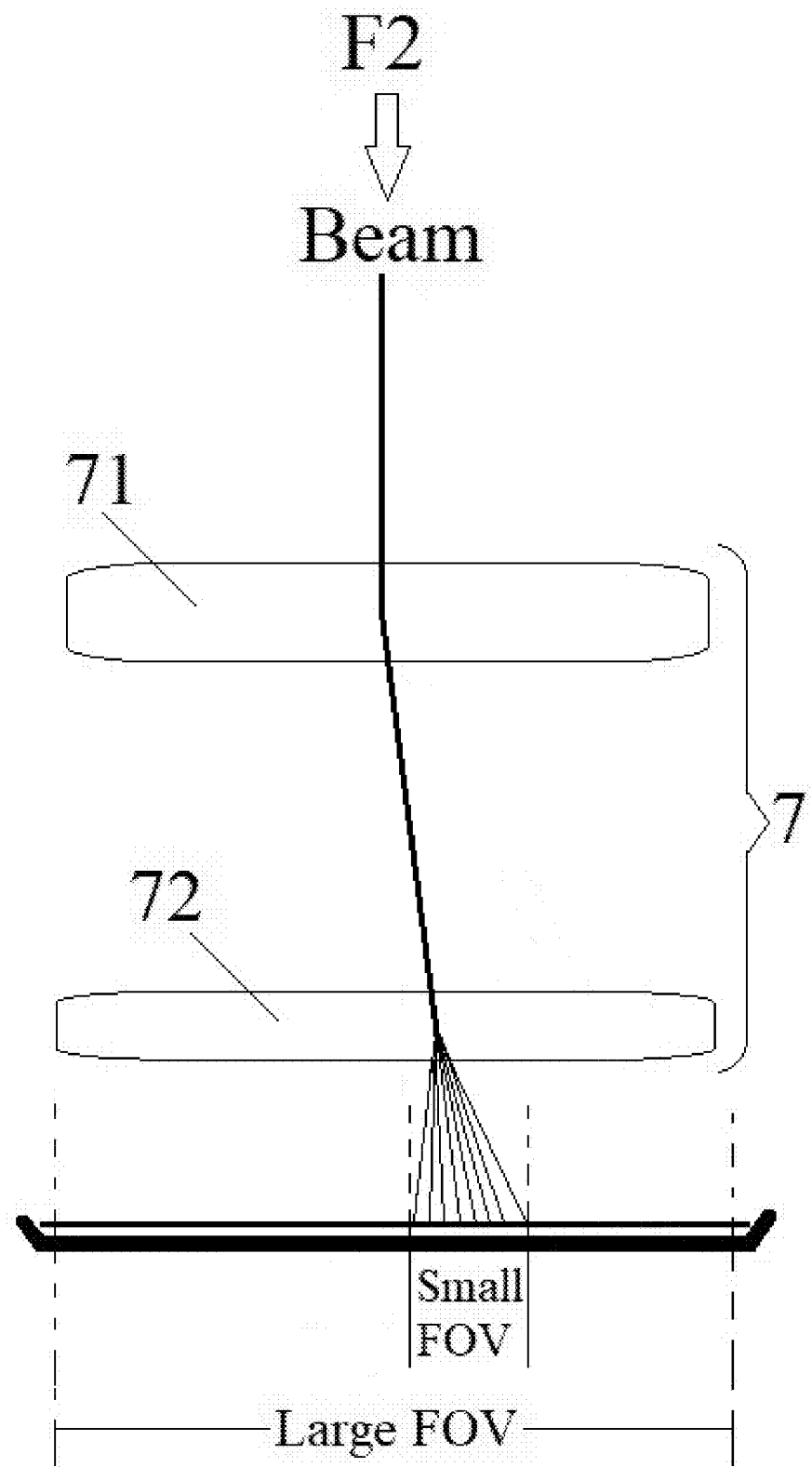
FIG. 16 illustrates a microscopic deflection sub-system causing the beam to scan across a small FOV in accordance with an exemplary embodiment of the present invention.

Instead, the user may run the second step by simply retrieving stored deflecting parameter(s) of the macroscopic deflection sub-system 71 which previously directed the beam to the center of the target small FOV 11. The retrieved deflecting parameter(s) of the macroscopic deflection sub-system 71 will then be re-applied to the subsystem 71, to direct the beam to the center of the target small FOV 11. Generally, the position of any small FOV within a large FOV may be controlled as desired by the macroscopic deflection sub-system 71 by retrieving and re-applying stored deflecting parameters (e.g. voltage). As shown in FIG. 16, after the position of the small FOV within the large FOV is fixed by the macroscopic deflection sub-system 71, the retrieved and re-applied deflecting parameter(s) of the macroscopic deflection sub-system 71 will remain unchanged. Then, the deflecting parameter(s) of the microscopic deflection sub-system 72 is/are varied to cause the beam to scan across the small FOV with a higher resolution.

In various embodiments of the invention, when the beam scans across the large FOV 10 in the first step, the spot F2 has a size A1. When the beam scans across the small FOV 11 within the large FOV 10 in the second step, the spot F2 has a size A2, and A2<A1. The inequation of A2<A1 will result in the resolution for scanning a small FOV is higher than that for a large FOV.

Typically, the size of the large FOV 10 is adjustable, and its image may range from 50 um×50 um to 200 um×200 um in size with a resolution of 0.5-20 nm. For example, the large FOV 10 may have a size of 100 um×100 um with a resolution of 8 nm. The small FOV 11 (e.g. POI, or area of interest) is also adjustable, and it may range from 0.5 um×0.5 um to 5 um×5 um in size with a resolution of 0.5-2 nm. For example, the small FOV may have a size of 5 um×5 um with a resolution of 0.5 nm.

As shown in FIG. 17, the macroscopic deflection sub-system 71 may include an upper deflector 71a, and a lower deflector 71b. The microscopic deflection sub-system 72 may be located between the upper deflector 71a and the lower deflector 71b of the macroscopic deflection system 71. The specimen holder 9 may be downstream with respect to the lower deflector 71b of the macroscopic deflection sub-system 71. As shown in FIG. 18, the microscopic deflection sub-system 72 may also include an upper deflector 72a and a lower deflector 72b.

Any other components known in any apparatus of charged-particle beam or their proper combination may be incorporated in the present invention. For a skilled person in the art, many of the components not shown in FIG. 10 are well-known, for example, suppressor electrode, beam extractor, anode, gun aperture, condenser lens that is responsible for primary beam formation, beam blanker, stigmator for the correction of asymmetrical beam distortions, objective aperture, SEM up detector, deflector, bright field (BF) detector, dark field (DF) detector. A system for the insertion into, motion within, and removal of specimens from the beam path is also needed. The system may include load lock, chamber interlock, lock port, loading and unloading mechanism, and transfer table. Other parts in the microscope may be omitted or merely suggested. In a specific yet exemplary electron microscope 1 as shown in FIG. 19, the source of charged particles may be an electron gun 2 configured to emit an electron beam through gun aperture 12. Along the beam trajectory, co-condenser 3 with magnetic coil 3C is placed between gun aperture 12 and co-condenser 4 with a magnetic coil 4C. The electron beam is focused to crossover spot F2 before it passes through beam blanking 13. After the beam passes through objective aperture 14, it is deflected by an upper deflector 71a and a lower deflector 71b in the macroscopic deflection sub-system 71. It can also be deflected by an upper deflector 72a and a lower deflector 72b in the microscopic deflection sub-system 72. In the meanwhile, the beam is focused by the magnetic objective lens 6 onto a specimen within the specimen holder 9. Electrons scattered from and penetrated through the specimen are detected by the BSE detector 15, BF detector 16 and DF detector 17 for generating specimen images. Deflectors 71a, 72a, 72b and 71b may reside in the central bore the magnetic objective lens 6, and they are disk-shaped rings which are axially symmetric about the Z-axis. Each deflector may have a same or different diameter and may fit at a particular position along the Z-axis. An actual bucket-shaped structure may be used to holds the deflectors, and the structure is inserted into the bucket-shaped space of the lens system thus making assembly easier.

The multiple deflection system (71a, 71b, 72a and 72b) is designed to control electron deflection with different FOV size. For example, deflectors or deflection nodes 71a and 71b control electron beam to be incident on a large FOV, while deflectors 72a and 72b on a small FOV size.

Figure 20:
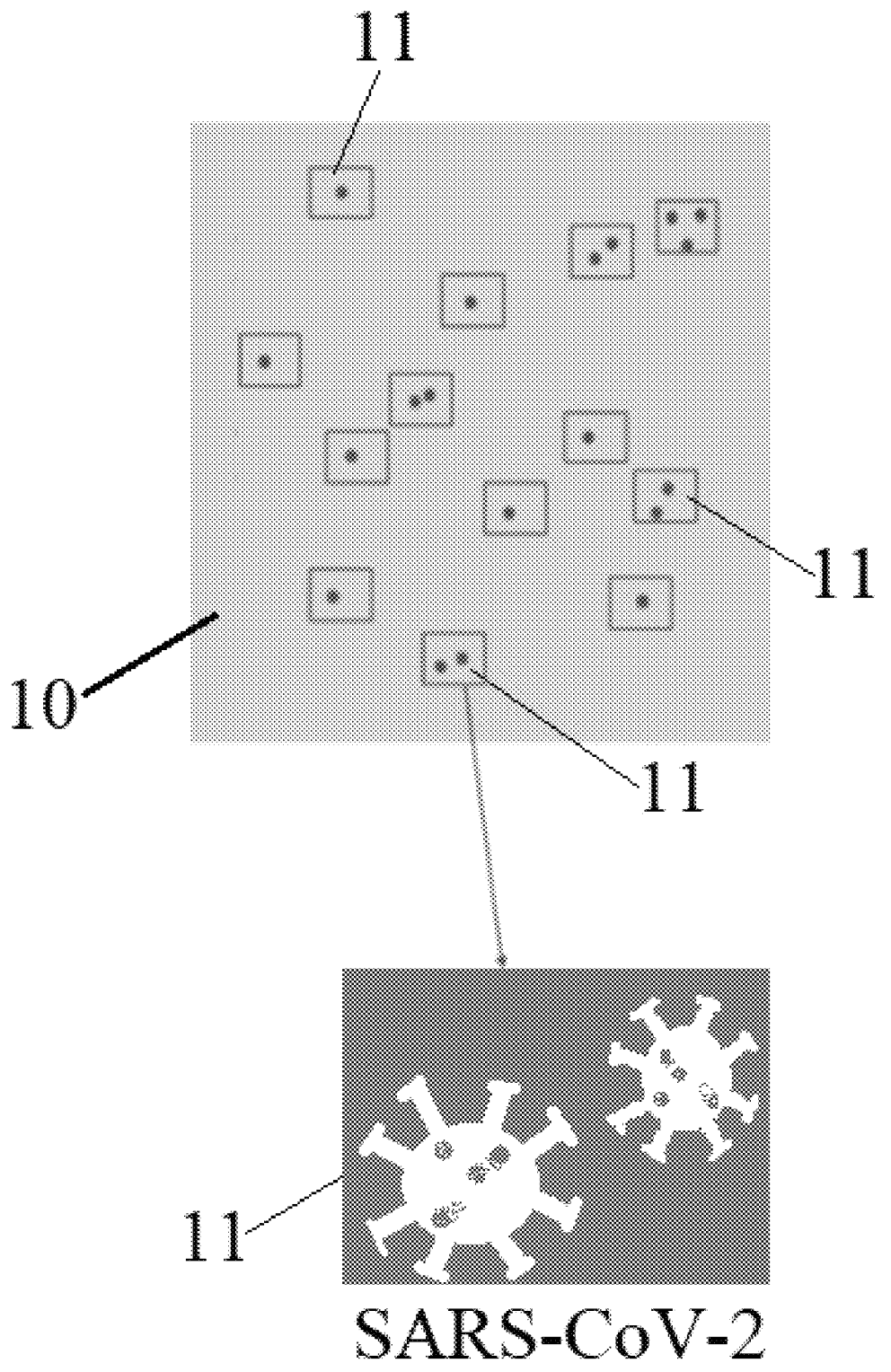

The novel EM column system as shown in FIG. 19 can scan larger FOV with low resolution (like 5, 10 or 20 nm) for the full FOV size. Then, the EM column can switch to high resolution (like 1 nm) automatically without any position and focus change and start immediately to scan high resolution image on any special location. A specific software algorithm can be used to control EM scanning of a larger FOV image with two deflectors (71a, 71b) and co-condensers (3, 4) in a lower resolution mode (i.e. a higher contribution from co-condenser 3 or lower contribution from co-condenser 4). The algorithm will detect related POI (pattern of interesting) and record related location(s). As shown in FIG. 20, the algorithm can detect related POI (pattern of interesting) such as the morphological features of Covid-19 virus (SARS-CoV-2) in a biological sample and record their location(s). Then the software will switch co-condensers (3, 4) to a higher resolution mode (i.e. a lower contribution from co-condenser 3 or a higher contribution from co-condenser 4). The two deflection nodes (71a and 71b) are set to or fixed to a controlled voltage. Other two deflection nodes (72a and 72b) are then used to scan a small FOV 11 with the higher resolution. As shown in the lower panel of FIG. 20, an image of Covid-19 virus (SARS-CoV-2) with a high resolution is acquired. A software system can combine BSE, DF, BF's images from TEM/STEM system and use a machine learning (ML) algorithm to generate an enhanced image with differenced image resolution. Such operations, tasks, and functions are sometimes referred to as being computer-executed, computerized, processor-executed, software-implemented, or computer-implemented. They may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or executable instructions that, when executed by one or more processor devices, cause the host computing system to perform the various tasks. In certain embodiments, the program or code segments are stored in a tangible processor-readable medium, which may include any medium that can store or transfer information. Examples of suitable forms of non-transitory and processor-readable media include an electronic circuit, a semiconductor memory device, a ROM, a flash memory, an erasable ROM (EROM), a floppy diskette, a CD-ROM, an optical disk, a hard disk, or the like.

Through the above description of the embodiments, those skilled in the art can understand clearly that the present application may be implemented by means of software plus necessary hardware platforms, or of course, may also be implemented all by software or hardware. Based on such understanding, the entirety of or a portion of that the technical solutions of the present application contribute over the background art may be embodied in the form of a software product. The computer software product may be stored in storage medium, such as ROM/RAM, disk, optical disk, etc., and comprise several instructions for enabling one computer apparatus (which may be a personal computer, a server, or a network equipment, etc.) to execute the methods described in the respective embodiments or described in certain parts of the embodiments of the present application.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A digital detector for detecting UV light or charged particles that comprises,
   (A) an array of pixels, wherein each pixel includes
      (i) a photon receiver configured for receiving incident photons,
      (ii) an optoelectronic converter for converting the photons into electrical signals, and
      (iii) a digitizer that digitizes the electrical signals; and
   (B) a layer of conversion material that is deposited onto the top of the array of pixels, wherein the conversion material is configured for receiving incident UV light or charged particles and converting the energy thereof into photons to be received by one or more of the photon receivers.

2. The digital detector according to claim 1, wherein the layer of conversion material is divided into blocks with separation walls.

3. The digital detector according to claim 2, wherein the conversion material within each block covers one or more pixels of the array of pixels, and
wherein, after the conversion material within each block receives the incident UV light or charged particles and converts the energy thereof into photons, the photons are received by the photon receiver(s) in said one or more pixels only and are thus prevented from being received by a photon receiver of a pixel near or surrounding said one or more pixels.

4. The digital detector according to claim 3, wherein the incident charged particles comprises an electron beam, and the conversion material comprises a fluorescent material.

5. The digital detector according to claim 1, wherein the array of pixels comprises pixels of complementary metal oxide semiconductor (CMOS) image sensor, and optionally wherein the CMOS image sensor does not include a color filter to filter the received photons.

6. The digital detector according to claim 1, wherein the array of pixels comprises pixels of charge-coupled device (CCD) image sensor.

7. A general optoelectronic apparatus/device comprising one or more digital detectors according to claim 1 selected from a digital imager, an analytical instrument, and an apparatus of charged-particle beam.

8. A method of optimizing system performance of an apparatus of charged-particle beam, comprising:
(i) providing an apparatus of charged-particle beam comprising a charged-particle optical column (such as an electron optical column) and a sample chamber;
(ii) removably inserting/affixing one or more digital detectors according to claim 1 onto one or more charged-particle optical components (such as electron optical components) within the column and/or chamber components within the sample chamber;
(iii) monitoring (1) the size, shape, intensity distribution of the charged-particle beam spot, (2) the beam position and beam angle, and (3) variations of said size, shape, intensity distribution, beam position and beam angle as a function of time, using one or more digital detectors of claim 1;
(iv) aligning the beam's position and/or beam angle based on the results as monitored from (1)-(3) in step (iii); and
(v) optimizing system performance of the apparatus of charged-particle beam based on the results as monitored from (1)-(3) in step (iii).

9. The method of optimizing system performance of an apparatus of charged-particle beam according to claim 8, wherein step (ii) is removably inserting/affixing one of the digital detectors onto a plate with at least one objective aperture 14 in the charged-particle optical column.

10. The method of optimizing system performance of an apparatus of charged-particle beam according to claim 8, wherein step (ii) is removably inserting/affixing one of the digital detectors onto a peripheral area of a specimen holder in the sample chamber.

11. The general optoelectronic apparatus/device according to claim 7, which is an apparatus of charged-particle beam,
wherein said one or more digital detectors are removably inserted/placed in a path of the charged-particle beam, or a trajectory of the charged-particle beam; and
wherein said one or more digital detectors are used for (1) monitoring the size, shape, intensity distribution of the charged-particle beam spot, (2) monitoring the beam position and beam angle, (3) monitoring variations of said size, shape, intensity distribution, beam position and beam angle as a function of time, (4) aligning the beam's position and/or beam angle based on the results as monitored from (1)-(3); and (5) optimizing system performance of the apparatus of charged-particle beam.

12. The apparatus of charged-particle beam according to claim 11, comprising a charged-particle optical column and a sample chamber, wherein said one or more digital detectors are insertable to (or can be affixed to) any place inside the charged-particle optical column and/or the sample chamber.

13. The apparatus of charged-particle beam according to claim 11, which is an electron microscope (such as STEM), or an electron beam lithography apparatus.

14. The apparatus of charged-particle beam according to claim 12, wherein the charged-particle optical column includes one or more charged-particle optical components along the beam path, selected from a source of charged particles configured to emit a beam of charged particles such as an electron gun (2) configured to emit an electron beam, condenser(s), stigmator(s), alignment coil(s), alignment plate(s), beam blanking(s), plate(s) with objective (or limiting) aperture(s), plate(s) with spread aperture(s), deflector(s), magnetic objective lens(es), and detector(s);
wherein the sample chamber includes one or more chamber components selected from a specimen holder (9) for holding a specimen under examination, a receptacle for receiving a lithographical workpiece (e.g. mask or wafer) being processed with, the beam, and a detector for detecting charged particles, and
wherein the one or more digital detectors are affixed to one or more movable parts selected from the charged-particle optical components and the chamber components.

15. The apparatus of charged-particle beam according, to claim 14, wherein said one or more charged-particle optical components within the column are electron optical components, which are selected from the following (from upstream to downstream): an electron gun (2) configured to emit an electron beam, a first co-condenser (3), a second co-condenser (4), a beam blanking (13), a plate with an objective aperture (14), a stigmator (71s), an upper macroscopic deflector (71a), an upper microscopic deflector (72a), a lower microscopic deflector (72b), a lower macroscopic deflector (71b), a magnetic objective lens (6), and a BSE or SE detector (15).

16. The apparatus of charged-particle beam according to claim 15, wherein one of the digital detectors is removably placed/affixed onto the plate with the objective aperture (14).

17. The apparatus of charged-particle beam according to claim 16, wherein the plate includes one, two or more objective apertures with different sizes.

18. The apparatus of charged-particle beam according to claim 15, wherein one of the digital detectors is removably placed/affixed onto a peripheral area of the specimen holder (9).

19. The apparatus of charged-particle beam according to claim 15, wherein one of the digital detectors is removably placed/affixed between the specimen holder (9) and BF/DF detectors (16, 17).

* * * * *